US009006116B2

(12) United States Patent
Terasaki

(10) Patent No.: US 9,006,116 B2
(45) Date of Patent: Apr. 14, 2015

(54) METHOD OF MANUFACTURING SEMICONDUCTOR DEVICE, SUBSTRATE PROCESSING METHOD AND SUBSTRATE PROCESSING APPARATUS

(75) Inventor: Masato Terasaki, Nakaniikawa-gun (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 14/123,576

(22) PCT Filed: May 17, 2012

(86) PCT No.: PCT/JP2012/062681
§ 371 (c)(1),
(2), (4) Date: Dec. 19, 2013

(87) PCT Pub. No.: WO2012/165166
PCT Pub. Date: Dec. 6, 2012

(65) Prior Publication Data
US 2014/0099797 A1 Apr. 10, 2014

(30) Foreign Application Priority Data
Jun. 3, 2011 (JP) ................. 2011-124779

(51) Int. Cl.
H01L 21/31 (2006.01)
H01L 21/02 (2006.01)
(Continued)

(52) U.S. Cl.
CPC ........ *H01L 21/02164* (2013.01); *C23C 16/402* (2013.01); *C23C 16/4488* (2013.01);
(Continued)

(58) Field of Classification Search
CPC .................... H01L 21/0228; H01L 21/02271; H01L 21/02211

USPC .................. 438/778, 782, 787, 788, 789, 790
See application file for complete search history.

(56) References Cited

U.S. PATENT DOCUMENTS

2001/0046792 A1 11/2001 Takahashi et al.
2004/0016987 A1 1/2004 Sawada et al.
(Continued)

FOREIGN PATENT DOCUMENTS

| JP | A-2001-345321 | 12/2001 |
| JP | A-2002-334867 | 11/2002 |
| JP | A-2004-47624 | 2/2004 |
| JP | A-2006-54432 | 2/2006 |
| JP | A-2006-190787 | 7/2006 |
| JP | A-2009-539268 | 11/2009 |
| JP | A-2010-153776 | 7/2010 |

OTHER PUBLICATIONS

International Preliminary Report on Patentability issued in International Application No. PCT/JP2012/062681 dated Dec. 4, 2013.
(Continued)

Primary Examiner — Kevin M Picardat
(74) Attorney, Agent, or Firm — Oliff PLC

(57) ABSTRACT

A silicon oxide film is formed, having a specific film thickness on a substrate by alternately repeating: forming a silicon-containing layer on the substrate by supplying a source gas containing silicon, to the substrate housed in a processing chamber and heated to a first temperature; and oxidizing and changing the silicon-containing layer formed on the substrate, to a silicon oxide layer by supplying reactive species containing oxygen to the substrate heated to the first temperature in the processing chamber under a pressure atmosphere of less than atmospheric pressure, the reactive species being generated by causing a reaction between an oxygen-containing gas and a hydrogen-containing gas in a pre-reaction chamber under a pressure atmosphere of less than atmospheric pressure and heated to a second temperature equal to the first temperature or higher than the first temperature.

14 Claims, 6 Drawing Sheets

(51) Int. Cl.
*C23C 16/40* (2006.01)
*C23C 16/448* (2006.01)
*C23C 16/455* (2006.01)
*C23C 16/56* (2006.01)
*C23C 16/52* (2006.01)

(52) U.S. Cl.
CPC ........... *C23C16/45525* (2013.01); *C23C 16/56* (2013.01); *C23C 16/52* (2013.01); *H01L 21/02271* (2013.01); *H01L 21/02211* (2013.01); *H01L 21/0228* (2013.01)

(56) References Cited

U.S. PATENT DOCUMENTS

2004/0168638 A1 9/2004 Ishii et al.
2006/0032442 A1 2/2006 Hasebe
2007/0281496 A1 12/2007 Ingle et al.
2010/0105192 A1 4/2010 Akae et al.

OTHER PUBLICATIONS

International Search Report issued in International Patent Application No. PCT/JP2012/062681 dated Aug. 21, 2012.

FIG. 3
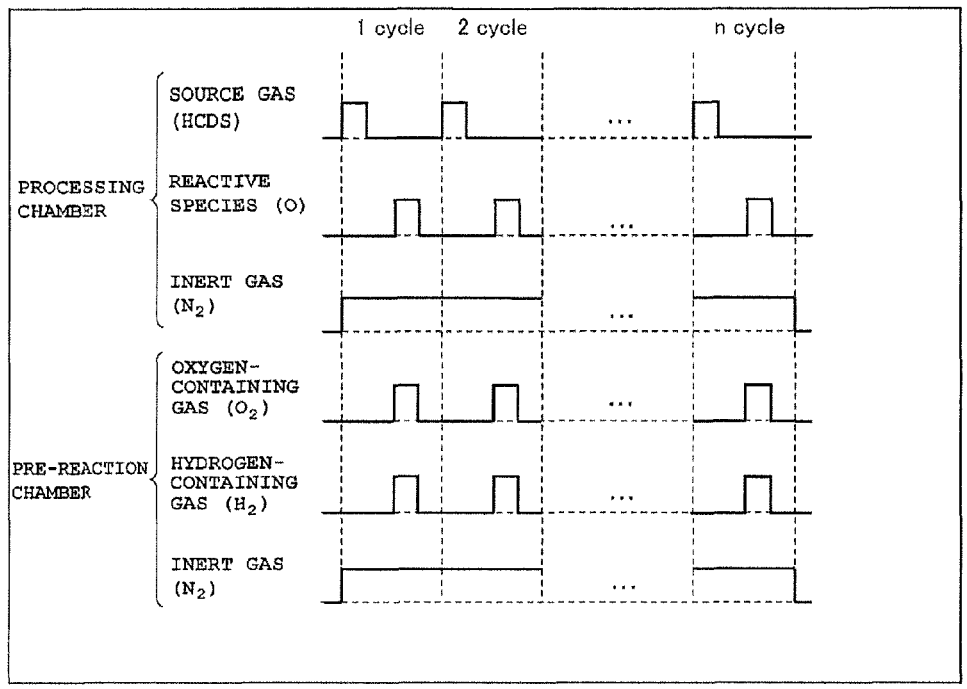
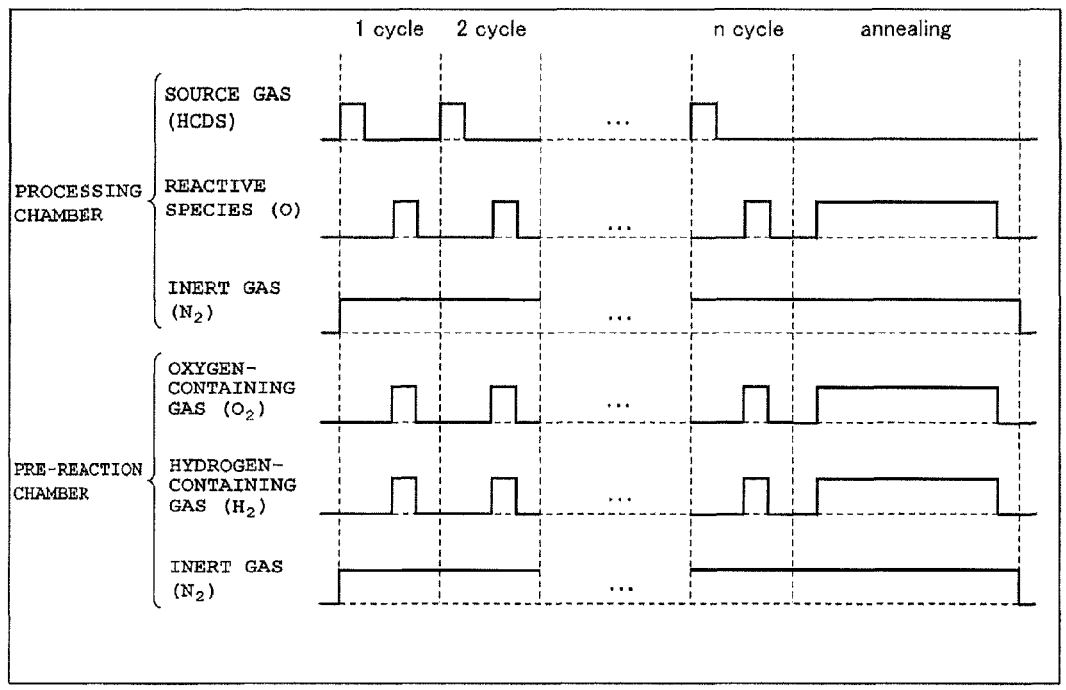
FIG. 4

METHOD OF MANUFACTURING SEMICONDUCTOR DEVICE, SUBSTRATE PROCESSING METHOD AND SUBSTRATE PROCESSING APPARATUS

BACKGROUND

1. Technical Field

The present invention relates to a method of manufacturing a semiconductor device, a substrate processing method including forming a thin film on a substrate, and a substrate processing apparatus.

2. Description of Related Art

As a method of forming an insulating film used for a semiconductor device such as a flash memory, for example, there is a method of forming a silicon oxide film on a substrate such as a silicon wafer by alternately repeating a supply of a source gas into a processing vessel in which the substrate is housed, and a supply of an oxygen-containing gas and a hydrogen-containing gas into the heated processing vessel under a pressure atmosphere of less than atmospheric pressure (for example see patent document 1).

Patent document 1: Japanese Patent Laid Open Publication No. 2010-153776

However, in recent years, low temperature processing is requested in a progress of a miniaturization of a semiconductor device, and under such a circumstance, a deposition rate is probably decreased, resulting in cut down on productivity. Therefore, a technique of increasing the deposition rate even under a low temperature and improving productivity, is required.

Accordingly, an object of the present invention is to provide a method of manufacturing a semiconductor device, a substrate processing method and a substrate processing apparatus, capable of increasing the deposition rate even under a low temperature, and improving productivity.

SUMMARY OF THE INVENTION

According to an aspect of the present invention, there is provided a method of manufacturing a semiconductor device, including:

forming a silicon oxide film having a specific film thickness on a substrate by alternately repeating:

forming a silicon-containing layer on the substrate by supplying a source gas containing silicon, to the substrate housed in a processing chamber and heated to a first temperature; and oxidizing and changing the silicon-containing layer formed on the substrate, to a silicon oxide layer by supplying reactive species containing oxygen to the substrate heated to the first temperature in the processing chamber under a pressure atmosphere of less than atmospheric pressure, the reactive species being generated by causing a reaction between an oxygen-containing gas and a hydrogen-containing gas in a pre-reaction chamber under a pressure atmosphere of less than atmospheric pressure and heated to a second temperature equal to the first temperature or higher than the first temperature.

According to other aspect of the present invention, there is provided a substrate processing method including:

forming a silicon oxide film having a specific film thickness on a substrate by alternately repeating:

forming a silicon-containing layer on the substrate by supplying a source gas containing silicon, to the substrate housed in a processing chamber and heated to a first temperature; and changing the silicon-containing layer formed on the substrate, to a silicon oxide layer by supplying reactive species containing oxygen to the substrate heated to the first temperature in the processing chamber under a pressure atmosphere of less than atmospheric pressure, the reactive species being generated by causing a reaction between an oxygen-containing gas and a hydrogen-containing gas in a pre-reaction chamber under a pressure atmosphere of less than atmospheric pressure and heated to a second temperature equal to the first temperature or higher than the first temperature.

According to further other aspect of the present invention, there is provided a substrate processing apparatus, including:

a processing chamber configured to house a substrate and process the substrate;

a first heating source configured to heat the substrate to a first temperature in the processing chamber;

a pre-reaction chamber configured to cause a reaction among a plurality of kinds of gases;

a second heating source configured to heat an inside of the pre-reaction chamber to a second temperature equal to the first temperature or higher than the first temperature;

a source gas supply system configured to supply a source gas containing silicon into the processing chamber;

an oxygen-containing gas supply system configured to supply an oxygen-containing gas into the pre-reaction chamber;

a hydrogen-containing gas supply system configured to supply a hydrogen-containing gas into the pre-reaction chamber;

a pressure adjustment part configured to adjust pressures in the processing chamber and the pre-reaction chamber; and a control part configured to control the first heating source, the second heating source, the source gas supply system, the oxygen-containing gas supply system, the hydrogen-containing gas supply system, and the pressure adjustment part, so that a silicon oxide film having a specific film thickness is formed on the substrate, by alternately repeating a process of forming a silicon-containing layer on the substrate by supplying the source gas to the substrate housed in the processing chamber and heated to the first temperature; and a process of oxidizing and changing the silicon-containing layer formed on the substrate, to an oxide layer by supplying reactive species containing oxygen to the substrate heated to the first temperature in the processing chamber under a pressure atmosphere of less than atmospheric pressure, the reactive species being generated by causing a reaction between an oxygen-containing gas and a hydrogen-containing gas in the pre-reaction chamber under a pressure atmosphere of less than atmospheric pressure and heated to the second temperature.

According to the present invention, there is provided a method of manufacturing a semiconductor device, a substrate processing method and a substrate processing apparatus capable of improving a deposition rate even under a low temperature and improving productivity.

BRIEF DESCRIPTION OF THE DRAWINGS

FIG. 3 is a view showing a timing of supplying gases in a first sequence of film formation of this embodiment.

FIG. 4 is a view showing the timing of supplying gases in a second sequence of film formation of this embodiment.

DETAILED DESCRIPTION OF THE INVENTION

Embodiments of the present invention will be described hereafter based on the drawings.

Figure 1:
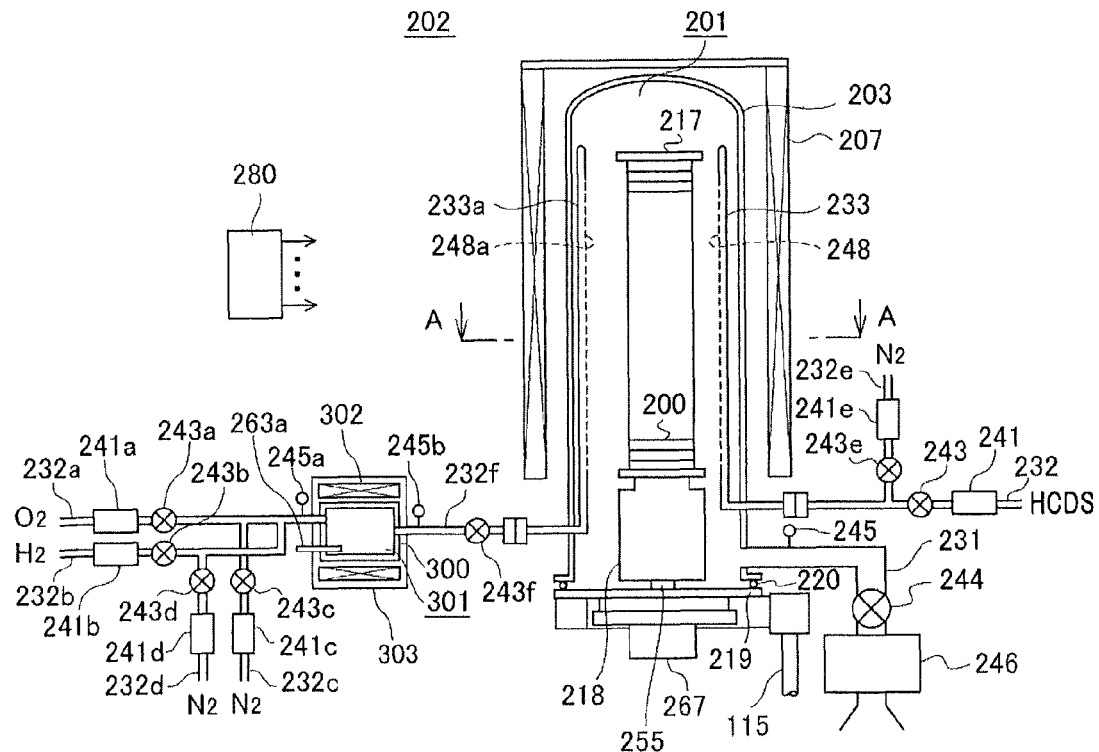
FIG. 1 is a schematic block diagram of a vertical processing furnace of a substrate processing apparatus suitably used in this embodiment, and is a view showing a processing furnace portion in a vertical cross-sectional view.
Figure 2:
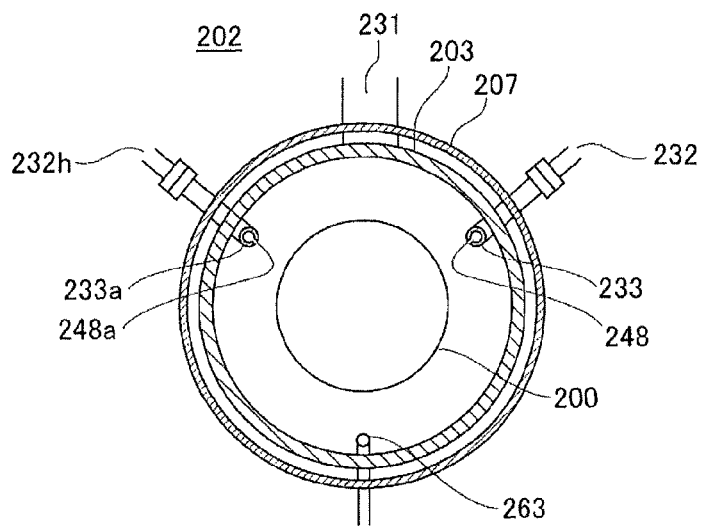
FIG. 2 is a schematic block diagram of the vertical processing furnace of the substrate processing apparatus suitably used in this embodiment, and is a view showing the processing furnace portion taken along the line A-A of FIG. 1.

FIG. 1 is a schematic block diagram of a vertical processing furnace of a substrate processing apparatus suitably used in this embodiment, and shows a processing furnace 202 portion in a vertical cross-sectional view. Further, FIG. 2 is a schematic block diagram of the vertical processing furnace of the substrate processing apparatus suitably used in this embodiment, and is a view showing the processing furnace 202 portion taken along the line A-A of FIG. 1. Note that the present invention is suitably applied not only to the substrate processing apparatus of this embodiment, but also to a substrate processing apparatus having a single wafer type, Hot Wall type, Cold Wall type processing furnaces.

As shown in FIG. 1, the processing furnace 202 has a first heater 207 as a first heating source (first heating unit). The first heater 207 has a cylindrical shape, and is vertically installed on a heater base (not shown) as a holding plate by being supported thereby. The first heater 207 is a resistance heating type heater (a heat source by resistance heating), and is configured to heat a wafer 200 in a processing chamber 201 described later, to a first temperature.

A process tube 203 as a reaction tube is disposed inside of the first heater 207 concentrically with the first heater 207. The process tube 203 is made of a heat-resistant material such as quartz ($SiO_2$) or silicon carbide (SiC), etc., for example, and is formed into a cylindrical shape, with an upper end closed and a lower end opened. A processing chamber (reaction chamber) 201 is formed in a cylinder hollow part of the process tube 203, so that wafers 200 being substrates, can be stored by a boat 217 described later in a state of being vertically arranged in multiple stages in a horizontal posture. A reaction vessel (processing vessel) is formed by the process tube 203.

A first nozzle 233 as a first gas introducing part, and a second nozzle 233a as a second gas introducing part, are provided in the process tube 203 so as to pass through a side wall of a lower part of the process tube 203. The first nozzle 233 and the second nozzle 233a are provided in an arc-shaped space between an inner wall of the process tube 203 constituting the processing chamber 201 and the wafers 200, extending from a lower part to an upper part of the inner wall of the process tube 203, so as to rise toward an upper part of a stacking direction of the wafers 200. Namely, the first nozzle 233 and the second nozzle 233a are respectively provided at side parts of a wafer arrangement region in which the wafers 200 are arranged. The first nozzle 233 and the second nozzle 233a are formed as L-shaped long nozzles. Gas supply holes 248, 248a for supplying gases, are provided on side faces of the first nozzle 233 and the second nozzle 233a. Each gas supply hole 248, 248a is opened to face a center of the process tube 203, so that the gas can be supplied toward the wafers 200. These gas supply holes 248, 248a are provided extending from a lower part to an upper part of the process tube 203, each of them having the same opening area and provided at the same opening pitch. A source gas supply pipe 232 is connected to the first nozzle 233, and a reaction gas supply pipe 232f is connected to the second nozzle 233a.

Thus, in the method of supplying gas according to this embodiment, gas is transferred through the nozzles 233 and 233a arranged in an arc-shaped longitudinal space which is defined by the inner wall of the process tube 203 and end portions of a plurality of stacked wafers 200, so that the gas is sprayed into the process tube 203 for the first time in the vicinity of the wafer 200 from the gas supply holes 248 and 248a opened respectively on the nozzles 233 and 233a, wherein a main flow of the gas in the process tube 203 is set in a parallel direction, namely in a horizontal direction, to the surface of the wafers 200. With this structure, the following effect can be obtained: namely, the gas can be evenly supplied to each wafer 200, and the film thickness of the thin film formed on each wafer 200 can be equalized. Although residual gas after reaction flows toward an exhaust port, namely in a direction of an exhaust pipe 231 as described later, a flowing direction of such a residual gas is suitably specified depending on a position of the exhaust port, and is not limited to a vertical direction.

Also, a metal manifold for supporting the process tube 203 is provided in a lower part of the process tube 203, and the first nozzle 233 and the second nozzle 233a may be provided so as to pass through a side wall of the metal manifold. In this case, an exhaust pipe 231 described later may be further provided in this metal manifold. In this case as well, the exhaust pipe 231 may be provided not in the metal manifold, but in the lower part of the process tube 203. Thus, a furnace throat part of the processing furnace is made of metal, and a nozzle, etc., may be attached to the metal furnace throat part.

A mass flow controller (MFC) 241 being a flow rate control unit (flow rate control part), and a valve 243 being an open/close valve are provided on the source gas supply pipe 232 sequentially from an upstream direction. Further, a first inert gas supply pipe 232e is connected to a downstream side of the valve 243 of the source gas supply pipe 232. A mass flow controller 241e being a flow rate control unit (flow rate control part), and a valve 243e being an open/close valve, are provided on the first inert gas supply pipe 232e sequentially from the upstream direction. The above-mentioned first nozzle 233 is connected to a tip part of the source gas supply pipe 232. A source gas supply system is mainly constituted of the source gas supply pipe 232, the mass flow controller 241, and the valve 243. The first nozzle 233 may be included in a source gas supply system. Also, a first inert gas supply system is mainly constituted of the first inert gas supply pipe 232e, the mass flow controller 241e, and the valve 243e. The first inert gas supply system also functions as a purge gas supply system.

As a source gas (silicon source gas) containing a specific element, namely, the source gas containing silicon (Si) (silicon source gas) as the specific element, for example, hexachlorodisilane ($Si_2Cl_6$, abbreviated as HCDS) gas is supplied into the processing chamber 201 through the mass flow controller 241, the valve 243, and the first nozzle 233. Namely, a source gas supply system is constituted as a silicon source gas supply system. Simultaneously at this time, inert gas may also be supplied into the source gas supply pipe 232 from the first inert gas supply pipe 232e through the mass flow controller 241e and the valve 243e. The inert gas supplied into the source gas supply pipe 232 is supplied into the processing chamber 201 together with the HCDS gas through the first nozzle 233. When using a liquid source in a liquid state under normal temperature and pressure like HCDS, the liquid source is vaporized by a vaporizer or a vaporizing system such as a bubbler, and is supplied as the source gas.

A valve 243f being an open/close valve is provided on the reaction gas supply pipe 232f. A pre-reaction vessel 300 constituting a pre-reaction chamber 301 described later, is connected to an upstream side of the reaction gas supply pipe 232f. A pressure sensor 245b as a pressure detection unit (pressure detection part) for detecting a pressure inside of the pre-reaction chamber 301, namely, the pressure at a secondary side (downstream side) of the pre-reaction chamber 301, is provided near the pre-reaction chamber 301 of the reaction gas supply pipe 232f. A reaction gas supply system is mainly constituted of the reaction gas supply pipe 232f and the valve 243f. Also, a piping part (communication part) as a connection part for connecting the pre-reaction chamber 301 and the processing chamber 201 and communicating both chambers, is constituted of the reaction gas supply pipe 232f and the second nozzle 233a, and by this piping part, a flow passage is formed for flowing a gas into the processing chamber 201 from the inside of the pre-reaction chamber 301.

The oxygen-containing gas supply pipe 232a and the hydrogen-containing gas supply pipe 232b are further connected to the pre-reaction vessel 300. Specifically, a joint piping part where the oxygen-containing gas supply pipe 232a and the hydrogen-containing gas supply pipe 232b are joined, is connected to the pre-reaction vessel 300, so that the oxygen-containing gas and the hydrogen-containing gas can be supplied into the pre-reaction chamber 301 from the oxygen-containing gas supply pipe 232a and the hydrogen-containing gas supply pipe 232b, through the joint piping part.

A mass flow controller 241a being a flow rate control unit (flow rate control part), and a valve 243a being an open/close valve, are provided on the oxygen-containing gas supply pipe 232a, sequentially from the upstream direction. Further, a second inert gas supply pipe 232c for supplying an inert gas, is connected to the downstream side of the valve 243a of the oxygen-containing gas supply pipe 232a. A mass flow controller 241c being a flow rate control unit (flow rate control part) and a valve 243c being an open/close valve, are provided on the third inert gas supply pipe 232c sequentially from the upstream direction. The pre-reaction chamber 301 is connected to the tip part (downstream end part) of the oxygen-containing gas supply pipe 232a through the joint piping part. An oxygen-containing gas supply system is mainly constituted of the oxygen-containing gas supply pipe 232a, the mass flow controller 241a, and the valve 243a. Also, a second inert gas supply system is mainly constituted of the second inert gas supply pipe 232c, the mass flow controller 241c, and the valve 243c. The second inert gas supply system also functions as the purge gas supply system.

A mass flow controller 241b being a flow rate control unit (flow rate control part) and a valve 243b being an open/close valve are provided on the hydrogen-containing gas supply pipe 232b sequentially from the upstream side. Further, a third inert gas supply pipe 232d for supplying the inert gas, is connected to the downstream side of the valve 243b of the hydrogen-containing gas supply pipe 232b. A mass flow controller 241d being a flow rate control unit (flow rate control part) and a valve 243d being an open/close valve, are provided on the third inert gas supply pipe 232d sequentially from the upstream direction. The pre-reaction chamber 301 is connected to the tip part (downstream part) of the hydrogen-containing gas supply pipe 232b through the joint piping part. A hydrogen-containing gas supply system is mainly constituted of the hydrogen-containing gas supply pipe 232b, the mass flow controller 241b, and the valve 243b. Also, a third inert gas supply system is mainly constituted of the third inert gas supply pipe 232d, the mass flow controller 241d, and the valve 243d. The third inert gas supply system also functions as the purge gas supply system.

As an oxygen-containing gas, namely, an oxygen ($O_2$) gas for example as an oxidizing gas, is supplied into the pre-reaction chamber 301 from the oxygen-containing gas supply pipe 232a, through the mass flow controller 241a and the valve 243a. Namely, the oxygen-containing gas supply system is configured as an oxidizing gas supply system. Simultaneously at this time, the inert gas may be supplied into the oxygen-containing gas supply pipe 232a from the second inert gas supply pipe 232c through the mass flow controller 241c and the valve 243c.

For example, the hydrogen-containing gas, namely, the hydrogen ($H_2$) gas for example as a reducing gas, is supplied into the pre-reaction chamber 301 from the hydrogen-containing gas supply pipe 232b, through the mass flow controller 241b and the valve 243b. Namely, a hydrogen-containing gas supply system is configured as a reducing gas supply system. Simultaneously at this time, the inert gas may also be supplied into the hydrogen-containing gas supply pipe 232b from the third inert gas supply pipe 232d, through the mass flow controller 241d and the valve 243d.

A pressure sensor 245a as a pressure detector (pressure detection part) for detecting the pressure inside of the pre-reaction chamber 301, namely, the pressure at a primary side (upstream side) of the pre-reaction chamber 301, is provided near the pre-reaction chamber 301 at the downstream side of the joint piping part where the oxygen-containing gas supply pipe 232a and the hydrogen-containing gas supply pipe 232b are joined.

The pre-reaction vessel 300 is made of a heat-resistant material such as quartz ($SiO_2$) or silicon carbide (SiC), etc., and is formed into a cylindrical shape. The pre-reaction chamber 301 is formed in a cylindrical hollow part of the pre-reaction vessel 300, and the pre-reaction chamber 301 is configured to cause a reaction between the oxygen-containing gas and the hydrogen-containing gas inside of the pre-reaction chamber thereof. One inlet and one outlet are provided in the pre-reaction vessel 300. The joint piping part where the oxygen-containing gas supply pipe 232a and the hydrogen-containing gas supply pipe 232b are joined, is connected to the inlet of the pre-reaction vessel 300, so that the oxygen-containing gas and the hydrogen-containing gas can be supplied into the pre-reaction chamber 301. The above-mentioned reaction gas supply pipe 232f is connected to the outlet of the pre-reaction vessel 300, so that reactive species including oxygen such as atomic oxygen (O), etc., which is generated by causing the reaction between the oxygen-containing gas and the hydrogen-containing gas in the pre-reaction chamber 301, can be supplied into the reaction gas supply pipe 232f. A second heater 302 as a second heating source (second heating unit) is provided around the pre-reaction vessel 300 so as to cover a cylindrical side face of the pre-reaction vessel 300. The second heater 302 has a cylindrical shape, and is provided concentrically with the pre-reaction vessel 300 which has also the cylindrical shape. The second heater 302 is a resistance heating type heater (a heat source by resistance heating), and is configured to heat the inside of the pre-reaction chamber 301 to a second temperature higher than the first temperature. The second heater 302 is configured so as to be controlled independently from the first heater 207. Further, a heat-insulating member 303 is provided around the second heater 302 and the pre-reaction vessel 300.

As described above, pressure sensors 245a, 245b are respectively provided near the joint piping part where the oxygen-containing gas supply pipe 232a and the hydrogen-containing gas supply pipe 232b are joined, and near the pre-reaction chamber 301 of the reaction gas supply pipe 232f. As described above, the pressure sensor 245a is configured to detect the pressure at the primary side (upstream side) of the pre-reaction chamber 301, namely, at an inlet side of the pre-reaction chamber 301, and the pressure sensor 245b is configured to detect the pressure at the secondary side (downstream side) of the pre-reaction chamber 301, namely, at an outlet side of the pre-reaction chamber 301. In at least an oxidizing step described later during the processing applied to the wafer 200, the pressure at the primary side of the pre-reaction chamber 301, and the pressure at the secondary side of the pre-reaction chamber 301, are monitored, to thereby monitor whether the pressure in the pre-reaction chamber 301 is maintained to a specific pressure of less than atmospheric pressure. At this time, the pressure in the piping part between the pre-reaction chamber 301 and the processing chamber 201 is also monitored whether the pressure is maintained to a specific pressure.

In order to monitor whether the pressure in the pre-reaction chamber 301 and the pressure in the joint piping part are maintained to a specific pressure of less than atmospheric pressure, the pressure at least at the secondary side of the pre-reaction chamber 301 may be monitored, and the pressure at the primary side may not be necessarily monitored. In this case, the pressure sensor 245a at the primary side of the pre-reaction chamber 301 may be omitted. However, by monitoring the pressure at the primary side of the pre-reaction chamber 301 and the pressure at the secondary side of the pre-reaction chamber 301, more reliable monitoring can be performed whether the pressure in the pre-reaction chamber 301 is maintained to a specific pressure of less than atmospheric pressure, and a more suitable amount of reactive species can be generated, and safety is further improved.

An exhaust pipe 231 for exhausting an atmosphere in the processing chamber 201, is provided in a lower part of the process tube 203. An exhaust port is formed at a connection part connecting the process tube 203 and the exhaust pipe 231. A vacuum pump 246 being a vacuum exhaust device is connected to the exhaust pipe 231, through a pressure sensor 245 being a pressure detector (pressure detection part) for detecting a pressure in the processing chamber 201, and an APC (Auto Pressure Controller) valve 244 being a pressure adjuster (pressure adjustment part). The APC valve 244 is the valve configured to perform vacuum exhaust/stop of vacuum exhaust in the processing chamber 201 by opening and closing the valve in a state of operating the vacuum pump 246, and further configured to adjust the pressure in the processing chamber 201 by adjusting an opening degree of the valve in a state of operating the vacuum pump 246. An exhaust system is mainly constituted of the exhaust pipe 231, the APC valve 244, and the pressure sensor 245. The vacuum pump 246 may also be included in the exhaust system. The exhaust system is configured so that the pressure in the processing chamber 201 is set to a specific pressure (vacuum degree) by adjusting the opening degree of the valve of the APC valve 244 based on pressure information detected by the pressure sensor 245, in a state of operating the vacuum pump 246.

During processing applied to the wafer 200, the opening degree of the APC valve 244 is adjusted (controlled) based on the pressure information detected by the pressure sensor 245, so that the pressure in the processing chamber 201 is set to a specific pressure of less than the atmospheric pressure. At this time, the pressure in the pre-reaction chamber 301 is also adjusted to a specific pressure of less than the atmospheric pressure at least in the oxidizing step described later. Further, the pressure in the piping part between the pre-reaction chamber 301 and the processing chamber 201 is also adjusted to a specific pressure of less than the atmospheric pressure. At this time, as described above, the pressure at the primary side and the pressure at the secondary side of the pre-reaction chamber 301 are monitored by the pressure sensors 245a and 245b, to thereby monitor whether the pressure in the pre-reaction chamber 301 and the pressure in the piping part are maintained to a specific pressure of less than the atmospheric pressure.

Here, when the pressure in the pre-reaction chamber 301 is maintained to a specific pressure of less than the atmospheric pressure, namely, maintained to 3999 Pa or less, and preferably 2666 Pa or less, the $O_2$ gas and the $H_2$ gas are reacted with each other at a specific temperature, for example at 450° C. or more, to thereby generate the reactive species such as atomic oxygen (O), etc. Particularly, when the pressure in the pre-reaction chamber 301 is maintained to the pressure of 1333 Pa or less, the $O_2$ gas and the $H_2$ gas are properly reacted with each other at a specific temperature, at 450° C. or more for example, to thereby generate the reactive species such as a proper amount of the atomic oxygen (O), etc., without generating $H_2O$. A generation efficiency of the reactive species such as atomic oxygen (O), etc., is highest when the pressure in the pre-reaction chamber 301 is 1333 Pa or less, and a next high generation efficiency is in a case that the pressure in the pre-reaction chamber 301 is set to 2666 Pa or less, and the next high generation efficiency is in a case that the pressure in the pre-reaction chamber 301 is set to 3999 Pa or less. Namely, the pressure in the pre-reaction chamber 301 is set to 3999 Pa or less, preferably set to 2666 Pa or less, and more preferably set to 1333 Pa or less. Under these pressures, even when heat of 450° C. or more is added, a reaction probability between the $O_2$ gas and the $H_2$ gas is relatively low. Therefore, there is no supply of a heat of reaction which is required for achieving a chain reaction. Then, a pressure variation caused by a local volume swelling is absorbed, and $H_2/O_2$ ratio can be deviated from an explosion range of a mixed gas of the $O_2$ gas and the $H_2$ gas.

Reversely, when the pressure in the pre-reaction chamber 301 exceeds 3999 Pa, the reaction between the $O_2$ gas and the $H_2$ gas is excessively advanced when a heat of 450° C. or more for example is added, thus generating relatively a large amount of $H_2O$, and reducing a generation amount of the reactive species such as atomic oxygen (O), etc., and a reaction processing focusing on the reactive species, cannot be properly performed. Further, a risk of explosion is generated depending on the $H_2/O_2$ ratio under the above-mentioned temperature and pressure.

Therefore, in this embodiment, when the pressure in the pre-reaction chamber 301 is maintained to a specific pressure of less than the atmospheric pressure, namely, to the pressure of 3999 Pa (30 Torr) or less, the $H_2$ gas is allowed to be supplied into the pre-reaction chamber 301, and when the pressure in the pre-reaction chamber 301 is not maintained to the pressure of 3999 Pa or less, namely, when the pressure exceeds 3999 Pa, the $H_2$ gas is not allowed to be supplied into the pre-reaction chamber 301.

For example, in a case of a closed state of the valve 243b when the pressure in the pre-reaction chamber 301 exceeds 3999 Pa, the valve 243b is set in a state unable to be opened, thus preventing the supply of the $H_2$ gas into the pre-reaction chamber 301. At this time, when the valve 243a is in a closed state, it is also acceptable that the valve 243a is set in a state unable to be opened, so that the $O_2$ gas is not allowed to be supplied into the pre-reaction chamber 301. Further, when the pressure in the pre-reaction chamber 301 exceeds 3999 Pa and the valve 243b is already in an open state, the valve 243b is set in a close state and the supply of the $H_2$ gas is stopped, to thereby stop the processing applied to the wafer 200. At this time, when the valve 243a is already in the open state, it is also acceptable that the valve 243a is set in the close state, so that the supply of the $O_2$ gas into the pre-reaction chamber 301 is stopped. However, in this case, the timing of stop of the supply of the $O_2$ gas needs to be properly adjusted by making the stop of the supply of the $O_2$ gas more delayed than the stop of the supply of the $H_2$ gas, in case that the $H_2/O_2$ ratio is within the explosion range.

Meanwhile, when the pressure in the pre-reaction chamber 301 is maintained to the pressure of 3999 Pa or less, the valve 243b is maintained in a state able to be opened, so that the $H_2$ gas is allowed to be supplied into the pre-reaction chamber 301. The valve 243a is also maintained in a state able to be opened, so that the $O_2$ gas is allowed to be supplied into the pre-reaction chamber 301.

Thus, in this embodiment, the pressure sensors 245a, 245b are used as triggers of an interlock, in such a way that the supply of the $H_2$ gas and further the supply of the $O_2$ gas into the pre-reaction chamber 301 are enabled only when the pressure in the pre-reaction chamber 301 is a specific pressure of less than the atmospheric pressure, by monitoring the pressure in the pre-reaction chamber 301 using the pressure sensors 245a, 245b, in at least the oxidizing step in the processing applied to the wafer 200. Such an interlock control is performed by a controller 280 described later.

In at least the oxidizing step in the processing applied to the wafer 200, the pressure information detected by the pressure sensors 245a, 245b may be taken into consideration, when the APC valve 244 is feedback-controlled, based on the pressure information detected by the pressure sensor 245. Namely, in at least the oxidizing step in the processing applied to the wafer 200, the APC valve 244 is feedback-controlled based on the pressure information detected by the pressure sensors 245, 245a, 245b, and may be controlled so that the pressure in the processing chamber 201 is set to a specific pressure of less than the atmospheric pressure, and the pressure in the pre-reaction chamber 301 and the pressure in the piping part are also set to specific pressures of less than the atmospheric pressure. A pressure control part (pressure adjustment part) is mainly constituted of the pressure sensors 245, 245a, 245b, and the APC valve 244.

A seal cap 219 as a furnace throat lid member capable of air-tightly closing a lower end opening of the process tube 203, is provided in a lower part of the process tube 203. The seal cap 219 is configured to abut on the lower end of the process tube 203 from a vertical lower side. The seal cap 219 is made of metal such as stainless, etc., and is formed into a disc shape. An O-ring 220 as a seal member abutted on the lower end of the process tube 203, is provided on an upper surface of the seal cap 219. A rotation mechanism 267 for rotating a boat 217 as a substrate holding tool described later, is installed on an opposite side of the processing chamber 201 across the seal cap 129. A rotary shaft 255 of the rotation mechanism 267 is passed through the seal cap 219 and is connected to the boat 217. The rotation mechanism 267 is configured to rotate the wafer 200 by rotating the boat 217. The seal cap 219 is configured to be vertically elevated by a boat elevator 115 as an elevation mechanism vertically installed outside of the process tube 203. The boat elevator 115 is configured to load and unload the boat 217 into/from the processing chamber 201 by elevating the seal cap 219.

The boat 217 as a substrate supporting tool, is made of a heat-resistant material such as quartz and silicon carbide, etc., and is configured to support a plurality of wafers 200 in a horizontal posture, with centers thereof aligned, and arranged in multiple stages. A heat insulating member 218 made of the heat-resistant material such as quartz and silicon carbide, etc., is provided in a lower part of the boat 217, so that a heat from the heater 207 is hardly transmitted to the seal cap 219 side. The heat-insulating member 218 may also be configured by a plurality of heat-insulating plates made of the heat-resistant material such as quartz and silicon carbide, etc., and a heat-insulating plate holder for supporting these heat-insulting plates in a horizontal posture in multiple stages.

As shown in FIG. 2, a temperature sensor 263 as a temperature detector, is installed in the process tube 203, and by adjusting a power supply state to the heater 207 based on the temperature information detected by the temperature sensor 263, the temperature in the processing chamber 201 is set to a desired temperature distribution. Similarly to the first nozzle 233 and the second nozzle 233a, the temperature sensor 263 is formed into the L-shape, and is provided along the inner wall of the process tube 203. Further, the temperature sensor 263a as a temperature detector is also installed in the pre-reaction chamber 301, and by adjusting the power supply to the second heater 302 based on the temperature information detected by the temperature sensor 263a, the temperature in the pre-reaction chamber 301 is set to a desired temperature.

During processing applied to the wafer 200, the power supply to the first heater 207 is adjusted based on the temperature information detected by the temperature sensor 263, and the temperature in the processing chamber 201 is controlled so as to be set to a first temperature. Further, the power supply to the second heater 302 is adjusted based on the temperature information detected by the temperature sensor 263a, and the temperatures in the processing chamber 201 and the pre-reaction chamber 301 are controlled to the second temperature higher than the first temperature.

Figure 6:
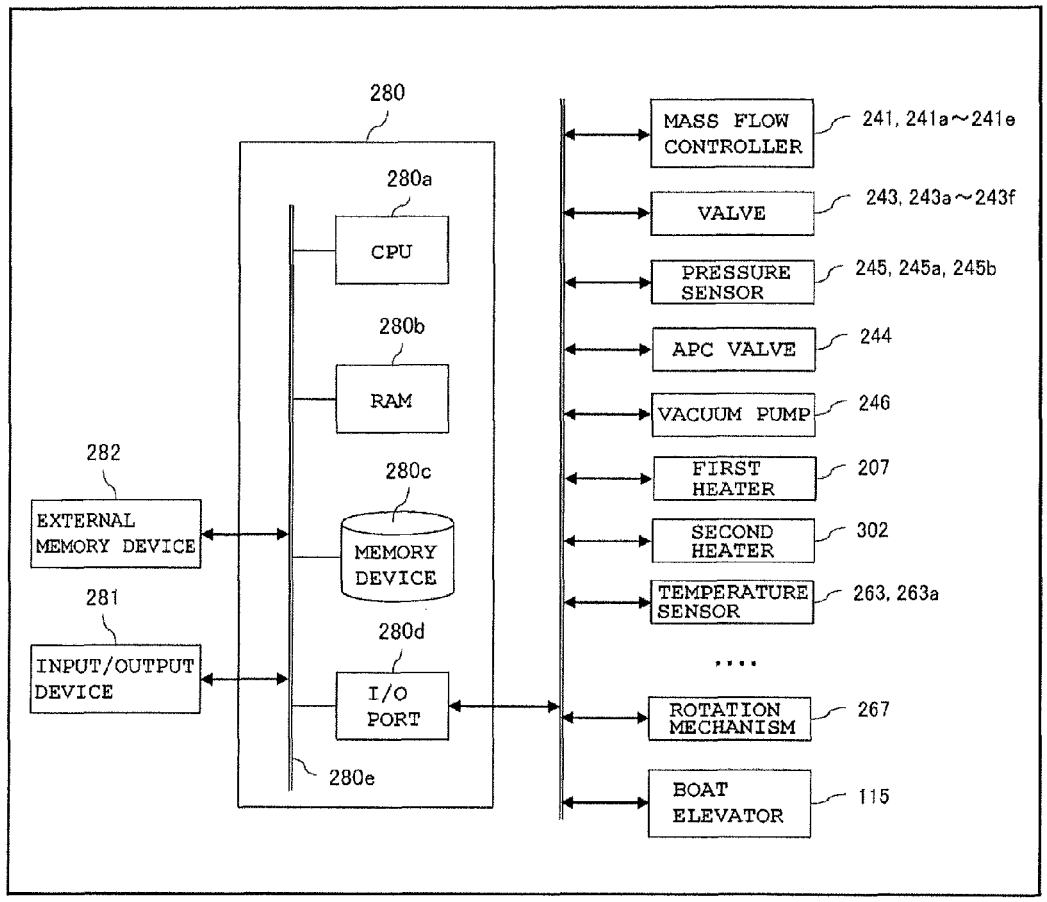
FIG. 6 is a schematic block diagram of a controller of a substrate processing apparatus suitably used in this embodiment.

As shown in FIG. 6, the controller 280 being a control part (control unit) is configured as a computer including CPU (Central Processing Unit) 280a, RAM (Random Access Memory) 280b, a memory device 280c, and an I/O port 280d. The RAM 280b, the memory device 280c, and the I/O port 280d are configured to perform data exchange with CPU 280a via an internal bus 280e. An input/output device 281 configured as a touch panel, etc., is connected to the controller 280.

The memory device 280c includes a flash memory, and HDD (Hard Disk Drive), etc., for example. A control program for controlling an operation of the substrate processing apparatus, and a process recipe, etc., indicating a procedure and a condition, etc., of substrate processing as will be descried later, are readably stored in the memory device 280c. The process recipe is a combination of recipes, so that each procedure in a substrate processing step described later is executed by the controller 280 to obtain a specific result, thus functioning as a program. The process recipe and the control program, etc., are generally simply called a program. When the term of the program is used in this specification, there are cases such as a case including the process recipe alone, a case including the control program alone, or a case including both of them. The RAM 280b is configured as a memory area (work area) in which the program and data, etc., read by the CPU 280a are temporarily stored.

The I/O port 280d is connected to the above-mentioned mass flow controllers 241, 241a, 241b, 241c, 241d, 241e, valves 243, 243a, 243b, 243c, 243d, 243e, 243f, pressure sensors 245, 245a, 245b, APC valve 244, vacuum pump 246, first heater 207, second heater 302, temperature sensors 263, 263a, rotation mechanism 267, and boat elevator 115, etc.

The CPU 280a is configured to read and execute the control program from the memory device 280c, and is configured to read the process recipe from the memory device 280c according to an input, etc., of an operation command from the input/output device 281. Then, the CPU 280a is configured to control a gas flow rate adjustment operation by the mass flow controllers 241, 241a, 241b, 241c, 241d, 241e, an open/close operation of the valves 243, 243a, 243b, 243c, 243d, 243e, 243f, pressure monitoring by the pressure sensors 245, 245a, 245b, a pressure adjustment operation based on the pressure sensor 245 by opening and closing operation of the APC valve, an interlock operation based on the pressure sensors 245a, 245b, a temperature adjustment operation of the first heater 207 based on the temperature sensor 263, a temperature adjustment operation of the second heater 302 based on the temperature sensor 263a, start/stop of the vacuum pump 246, a rotation speed adjustment operation of the rotation mechanism 267, and an elevating operation of the boat 217 by the boat elevator 115, or the like.

The controller 280 may be configured not only as a dedicated computer, but also as a general-purpose computer. For example, a non-transitory computer-readable recording medium storing the above-mentioned program (for example, a magnetic tape, a magnetic disc such as a flexible disc and a hard disc, etc., an optical disc such as CD and DVD, etc., an optical magnetic disc such as MO, etc., and a semiconductor memory such as a USB memory and a memory card, etc.) 282, is prepared, and by using the non-transitory recording medium 282, the program is installed in the general-purpose computer, to thereby constitute the controller 280 according to this embodiment. Means for supplying the program to the computer, is not limited to a case of supplying it through the non-transitory recording medium 282. For example, communication means such as Internet and a dedicated line, etc., may be used, to thereby supply the program not through the non-transitory recording medium 282. The memory device 280c and the non-transitory recording medium 282 are configured as computer readable recording media, which are generally called simply a recording medium hereafter. When using the term of the recording medium in this specification, there are cases such as a case including the memory device 280c alone, a case including the recording medium 282 alone, or a case including both of them.

Next, explanation is given for a sequence example in which the processing furnace of the above-mentioned substrate processing apparatus is used, to thereby form a silicon oxide film on the substrate as an insulating film, as one step of the manufacturing step of the semiconductor device. In the explanation hereafter, an operation of each part constituting the substrate processing apparatus is controlled by the controller 280.

(First Sequence of Film Formation)

FIG. 3 is a view showing the timing of supplying gases in a first sequence of film formation of this embodiment. An upper side view of FIG. 3 shows a timing of supplying gases into the processing chamber, and a lower side view shows the timing of supplying gases into the pre-reaction chamber. For convenience, FIG. 3 shows a timing of supplying a main substance to be supplied into the processing chamber and the pre-reaction chamber.

In the first sequence of film formation of this embodiment, a silicon oxide film ($SiO_2$ film) having a specific film thickness is formed on a substrate by alternately repeating: forming a silicon-containing layer (Si-containing layer) on the substrate by supplying a source gas (HCDS gas) containing silicon, to the substrate housed in a processing chamber and heated to a first temperature; and oxidizing and changing the silicon-containing layer formed on the substrate, to a silicon oxide layer ($SiO_2$ layer) by supplying reactive species (atomic oxygen (O)) containing oxygen to the substrate heated to the first temperature in the processing chamber under a pressurized atmosphere of less than atmospheric pressure, the reactive species being generated by causing a reaction between an oxygen-containing gas ($O_2$ gas) and a hydrogen-containing gas ($H_2$ gas) in a pre-reaction chamber under a pressurized atmosphere of less than the atmospheric pressure and heated to a second temperature higher than the first temperature.

Explanation is given hereafter more specifically. In first sequence of film formation according to this embodiment, explanation is given for a case that the HCDS gas is used as the source gas, the $O_2$ gas is used as the oxygen-containing gas, and the $H_2$ gas is used as the hydrogen-containing gas, to thereby form a $SiO_2$ film being an oxide film on the substrate as the insulating film, based on the sequence of film formation shown in FIG. 3.

When a plurality of wafers 200 are charged into the boat 217 (wafer charge), as shown in FIG. 1, the boat 217 supporting the plurality of wafers 200 is lifted by the boat elevator 115, and is loaded into the processing chamber 201 (boat load). In this state, the seal cap 219 is in a state of sealing the lower end of the process tube 203 through the O-ring 220.

Subsequently, the inside of the processing chamber 201 is vacuum-exhausted by the vacuum pump 246 so as to be a desired pressure (vacuum degree) of less than the atmospheric pressure. At this time, by opening the valve 243f of the reaction gas supply pipe 232f, the inside of the pre-reaction chamber 301 is also vacuum-exhausted by the vacuum pump 246 so as to be a desired pressure of less than the atmospheric pressure. Simultaneously, the inside of the piping part (inside of the reaction gas supply pipe 232f and inside of the second nozzle 233a) between the pre-reaction chamber 301 and the processing chamber 201 is also vacuum-exhausted by the vacuum pump 246 so as to be a desired pressure of less than the atmospheric pressure. The inside of the pre-reaction chamber 301 is vacuum-exhausted through the reaction gas supply pipe 232f, the second nozzle 233a, the processing chamber 201, and the exhaust pipe 231. At this time, the pressure in the processing chamber 201 is measured by the pressure sensor 245, and based on the measured pressure information, the APC valve 244 is feedback-controlled (pressure adjustment). The vacuum pump 246 is maintained in a continuously operation state, at least until the processing to the wafer 200 is completed.

At this time, the pressure at the primary side and the pressure at the secondary side of the pre-reaction chamber 301 are monitored by the pressure sensors 245a, 245b, and whether the pressure in the pre-reaction chamber 301 and the pressure in the piping part are maintained to a specific pressure of less than the atmospheric pressure, is monitored (pressure monitoring). Here, the interlock control is performed in such a way that when the pressure in the pre-reaction chamber 301 is maintained to a specific pressure of less than the atmospheric pressure, namely, when the pressure is maintained to the pressure of 3999 Pa (30 Torr) or less, the H₂ gas is allowed to be supplied into the pre-reaction chamber 301, and when the pressure in the pre-reaction chamber 301 is not maintained to the pressure of 3999 Pa or less, namely, when the pressure exceeds 3999 Pa, the H₂ is not allowed to be supplied into the pre-reaction chamber 301. The interlock control may also be performed for the supply of the O₂ gas into the pre-reaction chamber 301. Further, at this time, the APC valve 244 may be feedback-controlled based on the pressure information measured by the pressure sensors 245, 245a, 245b. The above-mentioned pressure adjustment and pressure monitoring are continuously performed until the processing to the wafer 200 is completed.

The inside of the processing chamber 201 and the wafer 200 in the processing chamber 201 are heated by the first heater 207 so as to be the first temperature. At this time, the power supply to the first heater 207 is feedback-controlled based on the temperature information detected by the temperature sensor 263 so that the inside of the processing chamber 201 is set to a desired temperature distribution (temperature adjustment). Further at this time, the inside of the pre-reaction chamber 301 is heated by the second heater 302 so as to be set to the second temperature higher than the first temperature. At this time, the power supply to the second heater 302 is feedback-controlled based on the temperature information detected by the temperature sensor 263a so that the inside of the pre-reaction chamber 301 is set to a desired temperature. Heating of the inside of the processing chamber 201 by the first heater 207, and heating of the inside of the pre-reaction chamber 301 by the second heater 302 are continuously performed, at least until the processing to the wafer 200 is completed.

Subsequently, the wafer 200 is rotated by rotating the boat 217 by the rotation mechanism 267. The rotation of the wafer 200 by rotating the boat 217, is continuously performed at least until the processing to the wafer 200 is completed. Thereafter, four steps described later are sequentially executed.

[Step 1] (Silicon-Containing Layer Forming Step)

The valve 243 of the source gas supply pipe 232 is opened, to thereby flow the HCDS gas to the source gas supply pipe 232. The HCDS gas flows from the source gas supply pipe 232, with its flow rate adjusted by the mass flow controller 241. The HCDS gas with the flow rate adjusted, is supplied from the gas supply holes 248 of the first nozzle 233, namely from a plurality of places of a region at a side of a wafer arrangement region corresponding to the wafer arrangement region in the processing chamber 201 set in a heated and depressurized state. The HCDS gas supplied into the processing chamber 201, flows down in the processing chamber 201 and is exhausted from the exhaust pipe 231 through the exhaust port provided at a lower end side of the wafer arrangement region (supply of the HCDS gas).

At this time, the valve 243e of the first inert gas supply pipe 232e is opened, and the N₂ gas may be supplied from the first inert gas supply pipe 232e as the inert gas. The N₂ gas is supplied into the source gas supply pipe 232, with its flow rate adjusted by the mass flow controller 241e. The N₂ gas with the flow rate adjusted, is mixed into the HCDS gas with the flow rate adjusted in the source gas supply pipe 232, and is supplied into the processing chamber 201 set in the heated and depressurized state from the gas supply holes 248 of the first nozzle 233, and is exhausted from the exhaust pipe 231.

At this time, in order to prevent an invasion of the HCDS gas into the second nozzle 233a, the valves 243c, 243d are opened, and the N₂ gas may be flowed into the second inert gas supply pipe 232c and the third inert gas supply pipe 232d.

The N₂ gas is supplied into the processing chamber 201 through the oxygen-containing gas supply pipe 232a, the hydrogen-containing gas supply pipe 232b, the reaction gas supply pipe 232f, and the second nozzle 233a, and is exhausted from the exhaust pipe 231.

At this time, the APC valve 244 is properly adjusted, and the pressure in the processing chamber 201 is maintained to the pressure in a range of 1 to 1333 Pa for example. The supply flow rate of the HCDS gas controlled by the flow controller 241 is set for example in a range of 10 to 2000 sccm (0.01 to 2 slm). The supply flow rate of the N₂ gas controlled by the mass flow controllers 241f, 241c, 241d, is set for example in a range of 100 to 2000 sccm (0.1 to 2 slm). The time for supplying the HCDS gas to the wafer 200, namely gas supply time (irradiation time) is set for example in a range of 1 to 120 seconds. The temperature of the first heater 207 is set so that a CVD reaction is caused in the processing chamber 201 in the above-mentioned pressure zone. Namely, the temperature of the first heater 207 is set so that the temperature of the wafer 200 is set to the first temperature, and for example in a range of 100 to 450° C. When the temperature of the wafer 200 is less than 100° C., the HCDS gas is hardly decomposed and is hardly adsorbed on the wafer 200. In recent years, low temperature processing is requested in a progress of a miniaturization of a semiconductor device, wherein the temperature of the wafer is set to 450° C. or less, and preferably set to 400° C. or less. Therefore, the temperature of the wafer 200 is preferably set in a range of 100° C. or more and 450° C. or less, and preferably set in a range of 100° C. or more and 400° C. or less.

By supplying the HCDS gas into the processing chamber 201 under the above-mentioned condition, namely under a condition of generating the CVD reaction, the silicon-containing layer of about less than one atomic layer to several atomic layers for example, can be formed on the wafer 200 (an underlayer of its surface). The silicon-containing layer may be an adsorption layer of the HCDS gas, or may be the silicon layer (Si layer), or may include both of them. However, the silicon-containing layer is preferably the layer containing silicon (Si) and chlorine (Cl).

Here, the silicon layer is a general name including a continuous layer made of silicon (Si), a discontinuous layer, and a silicon thin film formed by overlap of these layers. The continuous layer composed of silicon is also called the silicon thin film in some cases. Si forming the silicon layer also includes a case that bond between Si and Cl is not completely cut-off.

Further, the adsorption layer of the HCDS gas also includes a continuous chemical adsorption layer and a discontinuous chemical adsorption layer, of gas molecules of the HCDS gas. Namely, the adsorption layer of the HCDS gas includes a chemical adsorption layer of one molecular layer or less than one molecular layer composed of HCDS molecules. The HCDS molecules forming the adsorption layer of the HCDS gas include a case that the bond between Si and Cl is cut-off ($Si_xCl_y$ molecules). Namely, the adsorption layer of the HCDS gas includes the continuous chemical adsorption layer and the discontinuous chemical adsorption layer of $Si_2Cl_6$ molecules and/or $Si_xCl_y$ molecules.

The layer of less than one atomic layer means an atomic layer formed discontinuously, and the layer of one atomic layer means an atomic layer formed continuously. Further, the layer of less than one molecular layer means a molecular layer formed discontinuously, and the layer of one molecular layer means a molecular layer formed continuously.

The silicon layer is formed by deposition of Si on the wafer 200 under a condition that the HCDS gas is self-decomposed (thermally decomposed). The adsorption layer of the HCDS gas is formed by adsorption of the HCDS gas on the wafer 200 under a condition that a thermal decomposing reaction of HCDS is not generated. The film forming rate can be higher preferably in a case of forming the silicon layer on the wafer 200, than a case of forming the adsorption layer of the HCDS gas on the wafer 200.

When the thickness of the silicon-containing layer formed on the wafer 200 exceeds several atomic layers, an oxidizing action in step 3 described later, does not reach the whole body of the silicon-containing layer. Further, a minimum value of the silicon-containing layer that can be formed on the wafer 200, is less than one atomic layer. Therefore, the thickness of the silicon-containing layer is preferably set in a range of about less than one atomic layer to several atomic layers.

By setting the thickness of the silicon-containing layer to one atomic layer or less, namely, to one atomic layer, or less than one atomic layer, actions such as oxidation in step 3 described later can be relatively increased, and the time required for oxidation treatment can be shortened. The time required for forming the silicon-containing layer in step 1 can also be shortened. As a result, a processing time per one cycle can be shortened, and the processing time in total can also be shortened. Namely, the deposition rate can be increased. Further, by setting the thickness of the silicon-containing layer to one atomic layer or less, controllability of the uniformity of film thickness can be improved.

As the source gas containing silicon, in addition to HCDS, an inorganic source such as chlorosilane-based monochlorosilane ($SiH_3Cl$, abbreviated as MCS), tetrachlorosilane, namely silicontetrachloride ($SiCl_4$, abbreviated as STC), trichlorosilane ($SiHCl_3$, abbreviated as TCS), dichlorosilane ($SiH_2Cl_2$, abbreviated as DCS), trisilane ($Si_3H_8$, abbreviated as TS), disilane ($Si_2H_6$, abbreviated as DS), and monosilane ($SiH_4$, abbreviated as MS), etc.; and an organic source such as aminosilane-based tetrakisdimethylaminosilane ($Si[N(CH_3)_2]_4$, abbreviated as 4DMAS), trisdimethylaminosilane ($Si[N(CH_3)_2]_3H$, abbreviated as 3DMAS), bisdiethylaminosilane ($Si[N(C_2H_5)_2]H_2$, abbreviated as 2DEAS), and bistertiary butylaminosilane ($SiH_2[NH(C_4H_9)]_2$, abbreviated as BTBAS), etc., can be used. As the inert gas, in addition to the $N_2$ gas, rare gases such as Ar, He, Ne, Xe, etc., may be used.

[Step 2] (Purging Step)

After the silicon-containing layer is formed on the wafer 200, the valve 243 of the source gas supply pipe 232 is closed, to thereby stop the supply of the HCDS gas. At this time, the inside of the processing chamber 201 is vacuum-exhausted by the vacuum pump 246 while opening the APC valve 244 of the exhaust pipe 231, to thereby remove the remained HCDS gas from the processing chamber 201. At this time, the supply of the $N_2$ gas as the inert gas into the processing chamber 201 is maintained while opening the valves 243c, 243d, 243e. The $N_2$ gas functions as the purge gas, and thus, an effect of removing from the processing chamber 201 the HCDS gas remained in the processing chamber 201, can be further increased (removal of the remained gas).

The temperature of the first heater 207 is set so that the temperature of the wafer 200 is in a range of 100 to 450° C., similarly to the case of supplying the HCDS gas. The supply flow rate of the $N_2$ gas as the purge gas supplied from each inert gas supply system, is set in a range of 100 to 2000 sccm (0.1 to 2 slm) for example respectively. As the purge gas, in addition to the $N_2$ gas, rare gases such as Ar, He, Ne, Xe, etc., may be used.

At this time, the gas remained in the processing chamber 201 is not required to be completely removed, and the inside of the processing chamber 201 is not required to be completely purged. If an amount of the gas remained in the processing chamber 201 is small, no adverse influence is generated in step 3 performed thereafter. The flow rate of the $N_2$ gas supplied into the processing chamber 201 at this time, is not required to be large, and for example, by supplying the same amount of the $N_2$ gas as a volume of the process tube 203 (processing chamber 201), purge can be performed so as not to allow the adverse influence to be generated in step 3. Thus, by not completely purging the inside of the processing chamber 201, a purging time can be shortened, and the throughput can be improved. Further, consumption of the $N_2$ gas can be suppressed to minimum requirement.

[Step 3] (Oxidizing Step)

After the remained gas in the processing chamber 201 is removed, the valve 243a of the oxygen-containing gas supply pipe 232a is opened, to thereby flow the $O_2$ gas to the oxygen-containing gas supply pipe 232a. The $O_2$ gas flows from the oxygen-containing gas supply pipe 232a, with the flow rate adjusted by the mass flow controller 241a. The $O_2$ gas with the flow rate adjusted, is supplied into the pre-reaction chamber 301 heated to the second temperature and in the depressurized state. Simultaneously at this time, the valve 243b of the hydrogen-containing gas supply pipe 232b is opened, to thereby flow the $H_2$ gas to the hydrogen-containing gas supply pipe 232b. The $H_2$ gas flows from the hydrogen-containing gas supply pipe 232b, with the flow rate adjusted by the mass flow controller 241b. The $H_2$ gas with the flow rate adjusted, is supplied into the pre-reaction chamber 301 heated to the second temperature and in the depressurized state. The $O_2$ gas and the $H_2$ gas are mixed in the pre-reaction chamber 301 heated to the second temperature and set in the depressurized state (Supply of the $O_2$ gas+$H_2$ gas).

At this time, the valve 243c of the second inert gas supply pipe 232c is opened, and the $N_2$ gas may be supplied from the second inert gas supply pipe 232c as the inert gas. The $N_2$ gas is supplied into the oxygen-containing gas supply pipe 232a, with the flow rate adjusted by the mass flow controller 241c. In this case, a mixed gas of the $O_2$ gas and the $N_2$ gas is supplied from the oxygen-containing gas supply pipe 232a. Further at this time, the valve 243d of the third inert gas supply pipe 232d is opened, and the $N_2$ gas may be supplied from the third inert gas supply pipe 232d as the inert gas. The $N_2$ gas is supplied into the hydrogen-containing gas supply pipe 232b, with the flow rate adjusted by the mass flow controller 241d. In this case, a mixed gas of the $H_2$ gas and the $N_2$ gas is supplied from the hydrogen-containing gas supply pipe 232b. As the inert gas, in addition to the $N_2$ gas, rare gases such as Ar, He, Ne, Xe, etc., may be used.

At this time, the APC valve 244 is properly adjusted, and the pressure in the pre-reaction chamber 301 is maintained to the pressure in a range of 1 to 3999 Pa for example, preferably 1 to 2666 Pa, and more preferably 1 to 1333 Pa. Further, the pressure in the piping part between the pre-reaction chamber 301 and the processing chamber 201 is also maintained to the pressure in a range of less than the atmospheric pressure, for example 1 to 3999 Pa, preferably 1 to 2666 Pa, and more preferably 1 to 1333 Pa. The supply flow rate of the $O_2$ gas controlled by the mass flow controller 241a is set for example in a range of 100 to 10000 sccm (0.1 to 10 slm). The supply flow rate of the $H_2$ gas controlled by the mass flow controller 241b is set for example in a range of 100 to 10000 sccm (0.1 to 10 slm). Also, when the $N_2$ gas is supplied, the supply flow rate of the $N_2$ gas controlled by the mass flow controllers 241c, 241d is set for example in a range of 100 to 2000 sccm (0.1 to 2 slm). The temperature of the second heater 302 is set so that the temperature in the pre-reaction chamber 301 is set for example in a range of 450 to 1200° C., preferably 550 to 1100° C., and more preferably 600 to 1000° C. The second temperature is set to a higher temperature than the first temperature.

At this time, $H_2$ gas concentration ($H_2/(H_2+O_2)$) is set for example in a range of 5 to 50%, and preferably 10 to 33%. Namely, the above concentration is obtained for example under a condition that the $O_2$ gas ratio is not less than the $H_2$ gas ratio, preferably under a condition that the $O_2$ gas ratio is larger than the $H_2$ gas ratio. Namely an oxygen-rich condition is created. The concentration of the $H_2$ gas can be controlled by adjusting the ratio of the supply flow rate of the $H_2$ gas to the supply flow rate of the $O_2$ gas ($H_2/O_2$ flow rate ratio). For example, when the $H_2$ gas concentration ($H_2/(H_2+O_2)$) is controlled in a range of 5 to 50%, the $H_2/O_2$ flow rate ratio may be adjusted to the flow rate ratio in a range of 0.05 to 1.

By supplying the $O_2$ gas and the $H_2$ gas into the pre-reaction chamber 301 under the above-described condition, the $O_2$ gas and the $H_2$ gas are thermally activated and reacted by non-plasma under the heated and depressurized atmosphere, thus generating the reactive species (oxidizing species) containing oxygen such as atomic oxygen (O) (generation of the reactive species). Then, the reactive species generated in the pre-reaction chamber 301, is supplied from a plurality of places in the region at the side part of the wafer arrangement region corresponding to the wafer arrangement region in the processing chamber 201 set in the heated and depressurized state, through the reaction gas supply pipe 232f and the second nozzle 233a, together with unreacted O2 gas an H2 gas, etc. The reactive species and unreacted $O_2$ gas and $H_2$ gas, etc., supplied into the processing chamber 201, flow down in the processing chamber 201 and are exhausted from the exhaust pipe 231 through the exhaust port provided on the lower end side of the wafer arrangement region (supply of the reactive species).

At this time, in order to prevent the invasion of the $O_2$ gas and the $H_2$ gas into the first nozzle 233, the valve 243e is opened, and the $N_2$ gas may be flowed into the first inert gas supply pipe 232e. The $N_2$ gas is supplied into the processing chamber 201 through the source gas supply pipe 232 and the first nozzle 233, and is exhausted from the exhaust pipe 231.

At this time, the APC valve 244 is properly adjusted, and the pressure in the processing chamber 201 is maintained to less than the atmospheric pressure, for example in a range of 1 to 1333 Pa. The supply flow rate of the $N_2$ gas controlled by the mass flow controller 241e is set for example in a range of 100 to 2000 sccm (0.1 to 2 slm). The time for supplying the reactive species containing oxygen such as atomic oxygen (O), etc., to the wafer 200 is set for example in a range of 1 to 120 seconds. The temperature of the first heater 207 is set so that the temperature in the processing chamber 201 and the temperature of the wafer 200 are set in a similar temperature zone as the temperature for supplying the HCDS gas, namely set to the first temperature, and set for example in a range of 100 to 450° C. The first temperature is set to be lower than the second temperature. It is preferable to set the temperature of the first heater 207 so as to keep the temperature of the wafer 200 in a similar temperature zone in step 1 and step 3. Further, it is more preferable to set the temperature of the first heater 207 so as to keep the temperature of the wafer 200 in a similar temperature zone in step 1 to step 4 (descried later). In this case, the temperature of the first heater 207 is set so that the temperature of the wafer 200 is set to a specific temperature, for example in a range of 100 to 450° C. in step 1 to step 4 (described later).

By supplying the reactive species containing oxygen such as atomic oxygen (O), etc., generated in the pre-reaction chamber 301 and the unreacted $O_2$ gas and the $H_2$ gas, mainly the reactive species are reacted with at least a part of the silicon-containing layer formed on the wafer 200. Namely, mainly by an action of the reactive species, the oxidation treatment is performed to the silicon-containing layer, and by this oxidation treatment, the silicon-containing layer is changed (modified) to a silicon oxide layer (a $SiO_2$ layer, also simply called a SiO layer).

At least a part of the unreacted $O_2$ gas and $N_2$ gas supplied into the processing chamber 201, is thermally activated in the processing chamber 201 under the heated and depressurized atmosphere, thus also generating the reactive species containing oxygen such as atomic oxygen (O), etc., in the processing chamber 201. Then, the reactive species generated in the processing chamber 201 also contribute to the oxidation treatment applied to the silicon-containing layer. However, an amount of the reactive species that can be generated in a relatively low temperature zone (100 to 450° C.) like in the processing chamber 201 of this embodiment, is limited to be small.

In this oxidizing step, the $O_2$ gas and the $H_2$ gas are activated by heat and are reacted with each other without activating them by plasma, to thereby generate the reactive species containing oxygen such as atomic oxygen (O) and thermally oxidize the silicon-containing layer mainly by the action of the reactive species. Thus, a soft reaction can be caused, and the above-mentioned oxidation treatment can be softly performed.

As the oxygen-containing gas, namely as the oxidizing gas, in addition to the oxygen ($O_2$) gas, an ozone ($O_3$) gas, a nitric monoxide (NO) gas, and a nitrous oxide ($N_2O$) gas, etc., may be used. As the hydrogen-containing gas, namely as the reducing gas, in addition to the hydrogen ($H_2$) gas, a heavy hydrogen ($D_2$) gas, an ammonia ($NH_3$) gas, and a methane ($CH_4$) gas, etc., may be used. Namely, as the oxygen-containing gas, at least one of gases selected from a group consisting of the $O_2$ gas, $O_3$ gas, NO gas, and $N_2O$ gas, can be used, and as the hydrogen-containing gas, at least one of gases selected from a group consisting of the $H_2$ gas, $D_2$ gas, $NH_3$ gas, and $CH_4$ gas, can be used.

(Purging step)

After the silicon-containing layer is changed to the silicon oxide layer, the valve 232a of the oxygen-containing gas supply pipe 232a, and the valves 243a, 243b of the hydrogen-containing gas supply pipe 232b, are closed, to thereby stop the supply of the $O_2$ gas and the $H_2$ gas into the pre-reaction chamber 301, and stop the supply of the reactive species containing oxygen such as atomic oxygen (O), etc., into the processing chamber 201. At this time, the inside of the processing chamber 201 is vacuum-exhausted by the vacuum pump 246 while opening the APC valve 244 of the exhaust pipe 231, to thereby remove the remained reactive species and a reaction byproduct from the pre-reaction chamber 301 and the processing chamber 201. At this time, the valves 243c, 243d are opened, and the $N_2$ gas as the inert gas is supplied into the processing chamber 201 from each of the second inert gas supply pipe 232c and the third inert gas supply pipe 232d through the pre-reaction chamber 301, and is exhausted from the exhaust pipe 231. Further, the valve 243e is opened, and the $N_2$ gas as the inert gas is supplied into the processing chamber 201 from the first inert gas supply pipe 232e, and is exhausted from the exhaust pipe 231. The $N_2$ gas functions as the purge gas, and thus the inside of the pre-reaction chamber 301 and the inside of the processing chamber 201 are purged by the inert gas, and the effect of removing the reactive species and the gas remained in the pre-reaction chamber 301 and the processing chamber 201 can be further increased (removal of the remained gas).

The temperature of the first heater 207 is set so that the temperature of the wafer 200 is set in a range of 100 to 450° C. similarly to the case of supplying the HCDS gas. The supply flow rate of the $N_2$ gas as the purge gas supplied from each inert gas supply system, is set for example in a range of 100 to 2000 sccm (0.1 to 2 slm). As the purge gas, in addition to the $N_2$ gas, rare gases such as Ar, He, Ne, and Xe, etc., may be used.

At this time, the gas remained in the processing chamber 201 is not required to be completely removed, and the inside of the processing chamber 201 is not required to be completely purged. An adverse influence is not generated in step 1 performed thereafter, provided that the gas remained in the processing chamber 201 is little. In this case, the flow rate of the $N_2$ gas supplied into the processing chamber 201 is not required to be large, and for example by supplying the same amount as the volume of the process tube 203 (processing chamber 201), purge can be performed so as not to allow the adverse influence to occur in step 1. Thus, by not completely purging the inside of the processing chamber 201, a purging time can be shortened, and the throughput can be improved. Further, consumption of the $N_2$ gas can be suppressed to necessary minimum.

The above-mentioned steps 1 to 4 are set as one cycle, and by executing this cycle a specific number of times, preferably multiple numbers of times, the silicon oxide film ($SiO_2$ film, simply called SiO film hereafter) having the specific film thickness can be formed on the wafer 200. The film thickness of the silicon oxide film is set for example in a range of 2 to 20 nm.

When the processing of forming the silicon oxide film having the specific film thickness is ended, the supply of the $N_2$ gas as the inert gas into the processing chamber 201 is continued from each of the first inert gas supply pipe 232e, the second inert gas supply pipe 232c, and the third inert gas supply pipe 232d, while maintaining an open state of the valves 243e, 243c, and 243d, to thereby exhaust the $N_2$ gas from the exhaust pipe 231. The $N_2$ gas functions as the purge gas, and thus, the inside of the processing chamber 201 is purged by the inert gas, and the gas remained in the processing chamber 201 is removed from the processing chamber 201 (Purge). Thereafter, the atmosphere in the processing chamber 201 is replaced by the inert gas, and the pressure in the processing chamber 201 is returned to a normal pressure (return to the atmospheric pressure).

Thereafter, the seal cap 219 is descended by the boat elevator 115, and the lower end of the process tube 203 is opened, and the processed wafer 200 is unloaded to outside of the process tube 203 from the lower end of the process tube 203 in a state of being held by the boat 217 (boat unload). Thereafter, the processed wafer 200 is discharged from the boat 217 (wafer discharge). Thus, a series of processing of forming the silicon oxide film having the specific film thickness on the wafer 200, is ended.

Incidentally, in the oxidizing step performed by directly supplying the $O_2$ gas and the $H_2$ gas under a depressurized atmosphere in a high temperature zone of 450° C. or more and preferably 550° C. or more in which the wafers are arranged, a large amount of reactive species (oxidizing species) containing oxygen such as atomic oxygen (O), etc., can be generated by a direct reaction between the $O_2$ gas and the $H_2$ gas under the depressurized atmosphere, and a high oxidizability can be expected. However, in this embodiment, the temperature of the wafer 200 is maintained to a low temperature of 450° C. or less for example, and although the oxidizing step is also performed at such a low temperature under the depressurized atmosphere. a source adsorption temperature of the high dielectric insulating film (a metal oxide film) as shown in this embodiment is generally a low temperature of 400° C. or less, a thermal energy required for the above-mentioned reaction is insufficient in this temperature zone, and when the $O_2$ gas and the $H_2$ gas are directly supplied under such a low temperature depressurized atmosphere, the reactive species (oxide species) containing oxygen such as atomic oxygen (O), etc., cannot be generated, or even if the reactive species can be generated, the generation amount is limited to a small quantity.

Meanwhile, in the oxidizing step of this embodiment, the $O_2$ gas and the $H_2$ gas are previously reacted in the pre-reaction chamber 301 heated to the second temperature (450 to 1200° C.) higher than the first temperature (100 to 450° C.), under an atmosphere of less than the atmospheric pressure, to thereby generate a large quantity of reactive species (oxide species) containing oxygen such as atomic oxygen (O), etc., and the large quantity of reactive species thus generated, is supplied to the wafer 200 heated to the first temperature (100 to 450° C.) in the processing chamber 201 under the pressure of less than the atmospheric pressure, to thereby oxidize the silicon-containing layer formed on the wafer 200, so as to be changed to the silicon oxide layer.

Thus, according to the oxidizing step of this embodiment, the temperature (second temperature) in the pre-reaction chamber 301 is set to be higher than the temperature (first temperature) of the wafer 200 in the processing chamber 201, and therefore a generation amount of the reactive species containing oxygen such as atomic oxygen (O), etc., obtained by causing a reaction between the $O_2$ gas and the $H_2$ gas, can be more increased than the generation amount of the reactive species obtained by directly supplying the $O_2$ gas and the $H_2$ gas into the processing chamber 201 in which the wafer 200 is housed and is set to have the first temperature which is relatively a low temperature. Thus, the supply amount of the reactive species to the wafer 200, can be more increased than the supply amount of the reactive species to the wafer 200 in a case of directly supplying the $O_2$ gas and the $H_2$ gas. Namely, in a state that the temperature of the wafer 200 is maintained to the first temperature which is relatively a low temperature, the concentration of the reactive species in the processing chamber 201 can be more increased than the case of directly supplying the $O_2$ gas and the $H_2$ gas into the processing chamber 201 in which the wafer 200 is housed, with its temperature maintained to the same temperature, and a large quantity of the reactive species can be provided to the wafer 200.

Further, according to the oxidizing step of this embodiment, the temperature (second temperature) in the pre-reaction chamber 301 is set to be higher than the temperature (first temperature) of the wafer 200 in the processing chamber 201. Therefore, the generation amount of the reactive species containing oxygen such as atomic oxygen (O), etc., obtained by causing the reaction between the $O_2$ gas and the $H_2$ gas, can be set to the same as the generation amount of the reactive species obtained by directly supplying the $O_2$ gas and the $H_2$ gas into the processing chamber 201 in which the wafer 200 is housed and is set to have the second temperature. Thus, the supply amount of the reactive species to the wafer 200 can be set to the same as the supply amount of the reactive species in the case of directly supplying the $O_2$ gas and the $H_2$ gas into the processing chamber 201 in which the wafer 200 is housed and is set to have the second temperature. Namely, the reactive species of the same amount as the case of directly supplying the $O_2$ gas and the $H_2$ gas into the processing chamber 201 in which the wafer 200 is housed and is set to have the second temperature which is relatively a high temperature, can be supplied to the wafer 200, in a state that the temperature of the wafer 200 is maintained to the first temperature, which is relatively a low temperature.

Thus, according to this embodiment, when a low temperature treatment is applied to the wafer 200, the reactive species of the same concentration as the reactive species obtained when a high temperature treatment is applied to the wafer 200, can be supplied to the wafer 200 in a state that the temperature of the wafer is maintained to a low temperature of a limit temperature or less (for example, 450° C. or less in this embodiment) in each kind of process. Thus, in the low temperature treatment applied to the wafer 200, the oxidizability by the reactive species in the oxidizing step can be increased, and the oxidizing step can be performed similarly to the high temperature treatment. Further, by increasing the oxidizability by the reactive species in the oxidizing step, an oxidizing time can also be shortened, and thus, the film forming rate can be improved and productivity can be improved.

Further, according to this embodiment, the $O_3$ gas, and the $O_2$ gas excited by plasma are not used as the oxidizing agent, and therefore there is no necessity for installing an expensive ozonizer or plasma generation unit, etc., in the substrate processing apparatus, and therefore a great cost reduction can be realized. The oxidizing agent used in this embodiment, corresponds to the reactive species containing oxygen such as atomic oxygen (O), etc., and in order to generate the reactive species, at least the pre-reaction vessel 300, the second heater 302, and the pressure sensor 245b may be provided, and reactive species generation unit can be installed in the substrate processing apparatus at a low cost.

Further, it is confirmed that when the reactive species containing oxygen such as atomic oxygen (O), etc., used as the oxidizing agent in this embodiment, are generated in a temperature zone of 450° C. or more, namely in a temperature zone of at least 450 to 1200° C., the oxidizability is beyond the oxidizability of the $O_3$ gas in the same temperature zone and the oxidizability of the $O_2$ gas excited by plasma. Namely, according to this embodiment, even when the temperature of the wafer 200 (first temperature) is set to a low temperature of 100 to 450° C., by setting the second temperature to 450° C. or more, oxidation can be performed with the oxidizability beyond the oxidizability of the $O_3$ gas in the same temperature zone, and the oxidizability of the $O_2$ gas excited by plasma.

Namely, according to this embodiment, a higher oxidizability can be obtained at a lower cost, than a case of using the $O_3$ gas or the $O_2$ gas excited by plasma as the oxidizing agent, and the oxidizing time can be shortened. Thus, the film forming rate can be more increased than a case of using the $O_3$ gas or the $O_2$ gas excited by plasma as the oxidizing agent, and the productivity can be improved.

Further according to this embodiment, not only the pressure in the pre-reaction chamber 301 and the pressure in the processing chamber 201, but also the pressure in the piping part between the pre-reaction chamber 301 and the processing chamber 201, is maintained to the pressure atmosphere of less than the atmospheric pressure, during processing applied to the wafer 200. Thus, the reactive species containing oxygen such as atomic oxygen (O) generated in the pre-reaction chamber 301 can be introduced into the processing chamber 201 while suppressing the deactivation of the reaction species containing oxygen such as atomic oxygen (O), etc., generated in the pre-reaction chamber 301.

The energy of the reactive species is higher than a bonding energy of Si—N, Si—Cl, Si—H, Si—C contained in the silicon-containing layer to be subjected to the oxidation treatment. Therefore, by adding the energy of the reactive species to the silicon-containing layer to be subjected to the oxidation treatment, Si—N, Si—Cl, Si—H, and Si—C bonds contained in the silicon-containing layer are cut-off. N, Cl, H, C, with the bonds cut-off from Si, are removed from the silicon-containing layer, and are discharged as $N_2$, $Cl_2$, $H_2$, HCl, and $CO_2$, etc. Further, an extra bonding hand of Si as a result of cutting-off the bonds from N, Cl, H, C, is bonded to O contained in the reactive species, thus forming Si—O bond. Thus, the silicon-containing layer is oxidized, to thereby form a silicon oxide layer. Namely, according to the film formation sequence of this embodiment, a good quality silicon oxide film with extremely low concentration of nitrogen, chlorine, hydrogen, and carbon in the film, can be obtained.

(Second Sequence of Film Formation)

After the $SiO_2$ film is formed on the wafer 200 by the first sequence of film formation, annealing can also be performed for the purpose of modifying a film quality of the $SiO_2$ film formed on the wafer 200 by in-situ in the processing chamber 201, without discharging the wafer 200 from the inside of the processing chamber 201 after film formation. By such a modification treatment by annealing, impurities in the $SiO_2$ film can be further removed, and in-film impurity concentration can be further reduced.

A second sequence of film formation is an example of the method of continuously performing: forming the $SiO_2$ film on the wafer 200, and modifying the $SiO_2$ film formed on the wafer 200 by annealing, in the same processing chamber.

FIG. 4 shows a view showing the timing of supplying gases in the second sequence of film formation of this embodiment. The upper side view of FIG. 4 shows the timing of supplying gases into the processing chamber, and the lower side view of FIG. 4 shows the timing of supplying gases into the pre-reaction chamber. For the convenience, FIG. 4 shows the timing of supplying a main substance supplied into the processing chamber and the pre-reaction chamber.

In the second sequence of film formation of this embodiment, the silicon oxide film ($SiO_2$ film) having the specific film thickness is formed on the substrate by alternately repeating:

forming a silicon-containing layer (Si-containing layer) on the substrate by supplying the source gas (HCDS gas) containing silicon, to the substrate housed in the processing chamber and heated to a first temperature; and changing by oxidation the silicon-containing layer formed on the substrate, to a silicon oxide layer ($SiO_2$ layer) by supplying reactive species (atomic oxygen (O)) containing oxygen to the substrate heated to the first temperature in the processing chamber under a pressurized atmosphere of less than atmospheric pressure, the reactive species being generated by causing a reaction between an oxygen-containing gas ($O_2$ gas) and a hydrogen-containing gas ($H_2$ gas) in the pre-reaction chamber under the pressure atmosphere of less than the atmospheric pressure and heated to a second temperature higher than the first temperature. Thereafter, the silicon oxide film ($SiO_2$ film) having the specific film thickness formed on the substrate is modified, by supplying the reactive species (atomic oxygen (O)) containing oxygen to the substrate heated to the first temperature or a third temperature in the processing chamber under the pressurized atmosphere of less than atmospheric pressure, the reactive species being generated by causing a reaction between the oxygen-containing gas ($O_2$ gas) and the hydrogen-containing gas ($H_2$ gas) in the pre-reaction chamber under the pressure atmosphere of less than the atmospheric pressure and heated to the second temperature higher than the first temperature. The third temperature is higher than the first temperature, and is lower than the second temperature.

This will be more specifically described hereafter. In the second sequence of film formation of this embodiment, similarly to the first sequence of film formation, explanation is given for an example of forming the $SiO_2$ film being an oxide film as an insulating film on the substrate, using the HCDS gas as the source gas, the $O_2$ gas as the oxygen-containing gas, and the $H_2$ gas as the hydrogen-containing gas, based on the film formation sequence of FIG. 4.

The processing of forming the $SiO_2$ film having the specific film thickness on the wafer 200, and purging the inside of the processing chamber 201 with the inert gas, is performed similarly to the first sequence of film formation. Thereafter, the valve 243a of the oxygen-containing gas supply pipe 232a is opened, to thereby flow the $O_2$ gas to the oxygen-containing gas supply pipe 232a. The $O_2$ gas flows from the oxygen-containing gas supply pipe 232a, with the flow rate adjusted by the mass flow controller 241a. The $O_2$ gas with the flow rate adjusted, is supplied into the pre-reaction chamber 301 heated to the second temperature and set in the depressurized state. Simultaneously at this time, the valve 243b of the hydrogen-containing gas supply pipe 232b is opened, to thereby flow the $H_2$ gas to the hydrogen-containing gas supply pipe 232b. The $H_2$ gas flows from the hydrogen-containing gas supply pipe 232b, with the flow rate adjusted by the mass flow controller 241b. The $H_2$ gas with the flow rate adjusted, is supplied into the pre-reaction chamber 301 heated to the second temperature and set in the depressurized state. The $O_2$ gas and the $H_2$ gas are mixed in the pre-reaction chamber 301 heated to the second temperature and set in the depressurized state (supply of the $O_2$ gas+$H_2$ gas).

At this time, the valve 243c of the second inert gas supply pipe 232c is opened, and the $N_2$ gas as the inert gas may be supplied from the third inert gas supply pipe 232c. Further, the valve 243d of the third inert gas supply pipe 232d is opened, and the $N_2$ gas as the inert gas may be supplied from the third inert gas supply pipe 232d.

At this time, the APC valve 244 is properly adjusted, to thereby maintain the pressure in the pre-reaction chamber 301 to a pressure of less than the atmospheric pressure, and set for example in a range of 1 to 3999 Pa, preferably 1 to 2666 Pa, and more preferably 1 to 1333 Pa. Further, the pressure in the piping part between the pre-reaction chamber 301 and the processing chamber 201 is also set to the pressure of less than the atmospheric pressure, and set for example in a range of 1 to 3999 Pa, preferably 1 to 2666 Pa, and more preferably 1 to 1333 Pa. The supply flow rate of the $O_2$ gas controlled by the mass flow controller 241a is set for example in a range of 100 to 10000 sccm (0.1 to 10 slm). The supply flow rate of the $H_2$ gas controlled by the mass flow controller 241b is set for example in a range of 100 to 10000 sccm (0.1 to 10 slm). Further, when the $N_2$ gas is supplied, the supply flow rate of the $N_2$ gas controlled by the mass flow controllers 241c, 241d is set for example in a range of 100 to 2000 sccm (0.1 to 2 slm). The temperature of the second heater 302 is set so that the temperature in the pre-reaction chamber 301 is the second temperature, for example in a range of 450 to 1200° C., preferably 550 to 1100° C., and more preferably 600 to 1000° C. The second temperature is set to be higher than the first temperature.

The $H_2$ gas concentration ($H_2/(H_2+O_2)$) is set for example in a range of 5 to 50%, and preferably 10 to 33%. Namely, for example a condition that the $O_2$ gas ratio is not less than the $H_2$ gas ratio, preferably the condition that the $O_2$ gas ratio is larger than the $H_2$ gas ratio, namely the oxygen-rich condition is created. As described above, the $H_2$ gas concentration can be controlled by adjusting the ratio of the supply flow rate of the $H_2$ gas to the supply flow rate of the $O_2$ gas ($H_2/O_2$ flow rate ratio).

By supplying the $O_2$ gas and the $H_2$ gas into the pre-reaction chamber 301 under the above-mentioned condition, the $O_2$ gas and the $H_2$ gas are thermally activated and reacted by non-plasma under the heated and depressurized atmosphere, thereby generating the reactive species containing oxygen such as atomic oxygen (O), etc. (generation of reactive species). Then, the reactive species generated in the pre-reaction chamber 301 are supplied from a plurality of places in the region at the side part of the wafer arrangement region corresponding to the wafer arrangement region in the processing chamber 201 set in the heated and depressurized state, together with the unreacted $O_2$ gas and $H_2$ gas, etc., through the reaction gas supply pipe 232f and the second nozzle 233a. The reactive species and the unreacted $O_2$ gas and $H_2$ gas, etc., supplied into the processing chamber 201, flow down in the processing chamber 201 and are exhausted from the exhaust pipe 231 through the exhaust port provided on the lower end side of the wafer arrangement region (supply of the reactive species).

At this time, in order to prevent the invasion of the $O_2$ gas and the $H_2$ gas into the first nozzle 233, the valve 243e is opened, and the $N_2$ gas may be flowed into the first inert gas supply pipe 232e. The $N_2$ gas is supplied into the processing chamber 201 through the source gas supply pipe 232 and the first nozzle 233, and is exhausted from the exhaust pipe 231.

At this time, the APC valve 244 is properly adjusted, and the pressure in the processing chamber 201 is maintained to the pressure of less than the atmospheric pressure, and set for example in a range of 1 to 1333 Pa. The supply flow rate of the $N_2$ gas controlled by the mass flow controller 241e is set for example in a range of 100 to 2000 sccm (0.1 to 2 slm). The time for exposing the reactive species containing oxygen such as atomic oxygen (O), etc., to the wafer 200 is set for example in a range of 1 to 600 minutes. Namely, in the modification treatment by annealing, the time for supplying the reactive species to the wafer 200, is set to be longer than the time for supplying the reactive species to the wafer 200 in the oxidizing step when forming the $SiO_2$ film. The temperature of the first heater 207 is set so that the temperature in the processing chamber 201 and the temperature of the wafer 200 are set in the similar temperature zone as the case of forming the $SiO_2$ film, namely, set to the first temperature, and set for example in a range of 100 to 450° C. In the modification treatment by annealing, the temperature of the wafer 200 can also be set to a third temperature higher than a wafer temperature during formation of the $SiO_2$ film, and can be set for example in a range of 450 to 700° C., and preferably 450 to 600° C. However, the first temperature and the third temperature are set to lower temperatures than the second temperature. The temperature of the first heater 207 is preferably set so that the temperature of the wafer 200 is maintained to a similar temperature zone in a film formation time of the $SiO_2$ film and a modification treatment time, in consideration of the throughput. In this case, the temperature of the first heater 207 is set so that the temperature of the wafer 200 is set to the first temperature and for example so as to be a specific temperature in a range of 100 to 450° C., in a period from the formation of the $SiO_2$ film to the modification treatment.

By supplying the reactive species containing oxygen such as atomic oxygen (O), etc., and the unreacted $O_2$ gas and the $H_2$ gas generated in the pre-reaction chamber 301 into the processing chamber 201 under the above-mentioned condition, the modification treatment is performed to the $SiO_2$ film mainly by the action of the reactive species.

At least a part of the unreacted $O_2$ gas and $H_2$ gas supplied into the processing chamber 201, is thermally activated and reacted in the processing chamber 201 under the heated and depressurized atmosphere, and the reactive species containing oxygen such as atomic oxygen (O), etc., are also generated in the processing chamber 201. Then, the reactive species generated in the processing chamber 201 also contribute to the modification treatment applied to the $SiO_2$ film. However, the generation amount of the reactive species that can be generated in a relatively low temperature zone (100 to 450° C.) like in the processing chamber 201 of this embodiment, is limited to a small quantity.

In this modification treatment, the $O_2$ gas and the $H_2$ gas are thermally activated and reacted without being activated by plasma, to thereby generate the reactive species containing oxygen such as atomic oxygen (O), etc., and mainly by the action of this reactive species, the modification treatment is performed to the $SiO_2$ film, and thus, the soft reaction can be generated, and also the modification treatment can be softly performed.

In the annealing applied to the $SiO_2$ film, as described above, the modification treatment is performed to the $SiO_2$ film by mainly the action of the reactive species containing oxygen such as atomic oxygen (O) generated in the pre-reaction chamber. Then, by the modification treatment, the impurities in the $SiO_2$ film are removed. According to the modification treatment, a significant effect of removing the impurities in the film can be obtained at a low temperature, compared with $O_2$ annealing and $N_2$ annealing performed as a usual modification treatment. Further, the reactive species having the concentration equivalent to the concentration of the reactive species obtained when the high temperature treatment is performed to the wafer 200 in the state that the temperature of the wafer is maintained to a low temperature of not more than the limit temperature (for example 450° C. or less in this embodiment) in each kind of process, can be supplied to an insulating film to be modified, and thus, reactivity by the reactive species can be improved in the low temperature treatment applied to the wafer 200, and a film quality of the insulating film to be modified, can be improved similarly to the high temperature treatment. Further, by improving the reactivity by the reactive species in the modification treatment, the modification time can be shortened, and thus, the productivity can be improved. It is also confirmed that in such a modification treatment, there is an effect of reducing a natural oxide film of an underlayer of the $SiO_2$ film.

The energy of the reactive species is higher than the bonding energy of the Si—N, Si—Cl, Si—H, and Si—C contained in the $SiO_2$ film. Therefore, by giving the energy of the reactive species, to the $SiO_2$ to be annealed, Si—N, Si—Cl, Si—H, and Si—C bonds contained in the $SiO_2$ film are cut-off. N, H, Cl, and C cut-off from the bond with Si, are removed from the film, and are discharged as $N_2$, $H_2$, $Cl_2$, HCl, and $CO_2$, etc. Further, the extra bonding hand of Si as a result of cutting-off the bond from N, H, Cl, C, is bonded with O contained in the reactive species, to thereby form a Si—O bond. Further, at this time, the $SiO_2$ film is densified. Thus, the modification treatment is performed to the $SiO_2$ film. Namely, according to the annealing, an excellent $SiO_2$ film having extremely low concentrations of nitrogen, hydrogen, chlorine, and carbon in the film, can be obtained.

After end of the modification treatment, similarly to the formation of the $SiO_2$ film of the first sequence of film formation, purge of the inside of the processing chamber 201, return to the atmospheric pressure, boat unload, and wafer discharge are performed. Thus, a series of the processing of forming the $SiO_2$ film on the wafer 200, and thereafter modifying the $SiO_2$ film formed on the wafer 200 by annealing continuously by in-situ, is ended.

As described above, embodiments of the present invention have been specifically described. However, the present invention is not limited to the above-mentioned embodiments, and can be variously modified in a range not departing from the gist of the invention.

For example, in the above-mentioned embodiments, explanation is given for an example of forming the silicon oxide film containing silicon. However, the present invention can also be applied to a case of forming a film containing metal elements such as zirconium (Zr), hafnium (Hf), titanium (Ti), aluminum (Al), niobium (Nb), tantalum (Ta), and molybdenum (Mo), etc. For example, the present invention can also be applied to a case of forming a zirconium silicate (ZrSiO film), a zirconium aluminate film (ZrAlO film), a hafnium oxide film ($HfO_2$ film), a hafnium silicate film (HfSiO film), a hafnium aluminate film (HfAlO film), a titanium oxide film ($TiO_2$ film), an aluminum oxide film ($Al_2O_3$ film), a niobium oxide film ($Nb_2O_4$ film), a tantalum oxide film ($Ta_2O_5$ film), a molybdenum oxide film ($MoO_2$ film), etc., and the high dielectric constant insulating film obtained by combining or mixing them.

For example, when the $ZrO_2$ film is formed as a film containing Zr, not only an organic source such as tetrakis ethyl methyl amino zirconium ($Zr[N(C_2H_5)(CH_3)]_4$, abbreviated as TEMAZ), tetrakis dimethyl amino zirconium ($Zr[N(CH_3)_2]_4$, abbreviated as TDMAZ), and tetrakis diethyl amino zirconium ($Zr[N(C_2H_5)_2]_4$, abbreviated as TDEAZ), but also an inorganic source such as tetra chloro zirconium, namely zirconium tetrachloride ($ZrCl_4$) can be used as a source containing Zr. The gas similar to the gas of the above-mentioned embodiment can be used as the oxygen-containing gas and the hydrogen-containing gas. Also, the similar processing condition as the processing condition described in the above-mentioned embodiment, can be used as the processing condition at this time.

Further for example, when the $HfO_2$ film is formed as a film containing Hf, not only an organic source such as tetrakis ethyl methyl amino hafnium ($Hf[N(C_2H_5)(CH_3)]_4$, abbreviated as TEMAH), tetrakis dimethyl amino hafnium ($Hf[N(CH_3)_2]_4$, abbreviated as TDMAH), and tetrakis diethyl amino hafnium ($Hf[N(C_2H_5)_2]_4$, abbreviated as TDEAH), but also an inorganic source such as tetra chloro hafnium, namely hafnium tetrachloride ($HfCl_4$) can be used as a source containing Hf. The gas similar to the gas of the above-mentioned embodiment can be used as the oxygen-containing gas and the hydrogen-containing gas. Also, the similar processing condition as the processing condition described in the above-mentioned embodiment, can be used as the processing condition at this time.

Further for example, when the $TiO_2$ film is formed as the film containing Ti, not only an organic source such as tetrakis ethyl methyl amino titanium ($Ti[N(C_2H_5)(CH_3)]_4$, abbreviated as TEMAT), tetrakis dimethyl amino titanium ($Ti[N(CH_3)_2]_4$, abbreviated as TDMAT), and tetrakis diethyl amino titanium ($Ti[N(C_2H_5)_2]_4$, abbreviated as TDEAT), but also an inorganic source such as tetra chloro titanium, namely titanium tetrachloride ($TiCl_4$) can be used as a source containing Ti. The gas similar to the gas of the above-mentioned embodiment can be used as the oxygen-containing gas and the hydrogen-containing gas. Also, the similar processing condition as the processing condition described in the above-mentioned embodiment, can be used as the processing condition at this time.

Further for example, when the $Al_2O_3$ film is formed as the film containing Al, not only an organic source such as trimethyl aluminum ($Al(CH_3)_3$, abbreviated as TMA), but also an inorganic source such as trichloro aluminum, namely aluminum trichloride ($AlCl_3$), trifluoro aluminum namely aluminum trifluoride ($AlF_3$) can be used. The gas similar to the gas of the above-mentioned embodiment can be used as the oxygen-containing gas and the hydrogen-containing gas. Also, the similar processing condition as the processing condition described in the above-mentioned embodiment, can be used as the processing condition at this time.

Further for example, when the $Nb_2O_5$ film is formed as the film containing Nb, penta chloro niobium namely niobium penta chloride ($NbCl_5$), and penta fluoro niobium namely niobium penta fluoride ($NbF_5$), etc., can be used, as the source containing Nb. The gas similar to the gas of the above-mentioned embodiment can be used as the oxygen-containing gas and the hydrogen-containing gas. Also, the similar processing condition as the processing condition described in the above-mentioned embodiment, can be used as the processing condition at this time.

Further for example, when the $Ta_2O_5$ film is formed as the film containing Ta, penta chloro tantalum namely tantalum penta chloride ($TaCl_5$), penta fluoro tantalum namely tantalum penta fluoride ($TaF_5$), penta ethoxy tantalum ($Ta(OC_2H_5)_5$, abbreviated as PET), tris diethyl amino tertiary butyl imino tantalum ($Ta(NC(CH_3)_3)(N(C_2H_5)_2)_3$, abbreviated as TBTDET), etc., can be used as the source containing Ta. The gas similar to the gas of the above-mentioned embodiment can be used as the oxygen-containing gas and the hydrogen-containing gas. Also, the similar processing condition as the processing condition described in the above-mentioned embodiment, can be used as the processing condition at this time.

Further for example, when the $MoO_2$ film is formed as the film containing Mo, penta chloro molybdenum namely molybdenum penta chloride ($MoCl_5$), and penta fluoro molybdenum namely molybdenum penta fluoride ($MoF_5$), etc., can be used as the source. The gas similar to the gas of the above-mentioned embodiment can be used as the oxygen-containing gas and the hydrogen-containing gas. Also, the similar processing condition as the processing condition described in the above-mentioned embodiment, can be used as the processing condition at this time.

Namely, according to the present invention, an excellent metal oxide film can be formed at a lower temperature than conventional, for example at 450° C. or less, and at a high film forming rate.

An effect of removing the impurities of each kind of the insulating films by annealing in the second sequence of film formation and the eighth sequence of film formation will be focused next. Then, it is confirmed that when the anneal treatment is used for modifying the silicon oxide film in the above-mentioned embodiment, particularly the H-concentration and the Cl-concentration in the impurities in the film can be reduced, and meanwhile, when the annealing treatment of the above-mentioned embodiment is used for modifying the metal oxide film, particularly the H-concentration, the Cl-concentration, the C-concentration, and the N-concentration in the impurities in the film can be reduced.

Further for example, in the above-mentioned embodiment, explanation is given for an example of setting the second temperature to a higher temperature than the first temperature (second temperature>first temperature). However, the second temperature may be equal to the first temperature (second temperature=first temperature). Namely, the temperature in the pre-reaction chamber can be equal to the temperature in the processing chamber. As shown in the example of the above-mentioned $SiO_2$ film, this is effective particularly in a process under no restriction of temperature, and particularly, this is effective when the first temperature can be set to 450° C. or more (the temperature allowing the reaction to occur between the oxygen-containing gas and the hydrogen-containing gas, and generating the reactive species such as atomic oxygen (O), etc.).

For example in this case, both the temperature in the pre-reaction chamber and the temperature in the processing chamber are set to the first temperature, and the reaction is started between the oxygen-containing gas and the hydrogen-containing gas in the pre-reaction chamber set in the depressurized state and heated to the first temperature, and the reaction can be advanced in the processing chamber set in the depressurized state and heated to the first temperature, and the concentration of the atomic oxygen obtained at this temperature can be maximum. In this case, the reaction between the oxygen-containing gas and the hydrogen-containing gas is not started in the processing chamber, but is started in the pre-reaction chamber, and the pre-reaction chamber functions as a buffer of adjusting a reaction delay time between the oxygen-containing gas and the hydrogen-containing gas. In this case, 450 to 600° C. can be given for example as the first temperature.

Thus, even if the second temperature is set to be equal to the first temperature, the delay time between the oxygen-containing gas and the hydrogen-containing gas in a low temperature zone can be improved. Namely, not only by setting the second temperature to be higher than the first temperature (second temperature>first temperature), but also by setting the second temperature to be equal to the first temperature (second temperature=first temperature), namely, by setting the second temperature equal to the first temperature or higher than the first temperature (second temperature first temperature), the reaction delay between the oxygen-containing gas and the hydrogen-containing gas at the low temperature zone can be improved.

Further, in the above-mentioned embodiment, explanation is given for an example of performing film formation using the batch type substrate processing apparatus for processing a plurality of substrates at once. However, the present invention is not limited thereto, and can be suitably applied to a case that the film formation is performed using a single wafer processing type substrate processing apparatus for processing one or a plurality of substrates at once.

Figure 7:
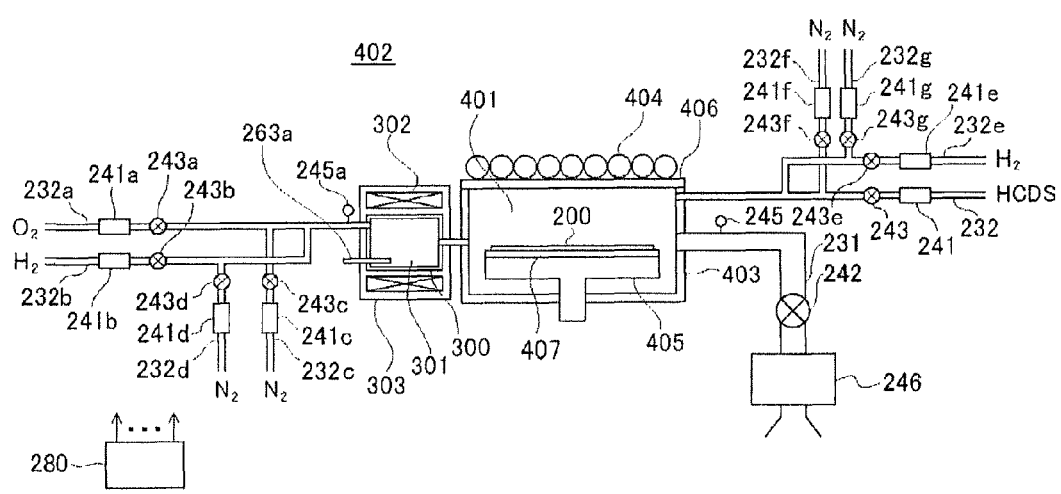
FIG. 7 is a schematic block diagram of a single wafer processing furnace of a substrate processing apparatus according to a modified example of this embodiment, and is a view showing a processing furnace portion in a vertical cross-sectional view.

For example, as shown in FIG. 7, the present invention can be suitably applied to a case that the substrate processing apparatus having a first heating source not as a resistance heating heater but as a lamp heater, and having a single wafer processing cold wall type processing furnace for heating a wafer by light irradiation to the wafer using a lamp, namely by an energy by light absorption of the wafer, is used to perform film formation. A processing furnace 402 of this modified example has a processing vessel 403 forming a processing chamber 401; a lamp 404 as a first heating source; a quartz window 406 for transmitting a light; and a supporting table 405 including a susceptor 407 for supporting one wafer 200 in a horizontal posture. Further, in the processing furnace 402 of this modified example, the piping part connecting the pre-reaction chamber 301 and the processing chamber 401 is eliminated, so that the pre-reaction chamber 301 and the processing chamber 401 are directly connected. In FIG. 7, the same signs and numerals are assigned to substantially the same element as the element described in FIG. 1 and FIG. 2, and explanation thereof is omitted.

Figure 8:
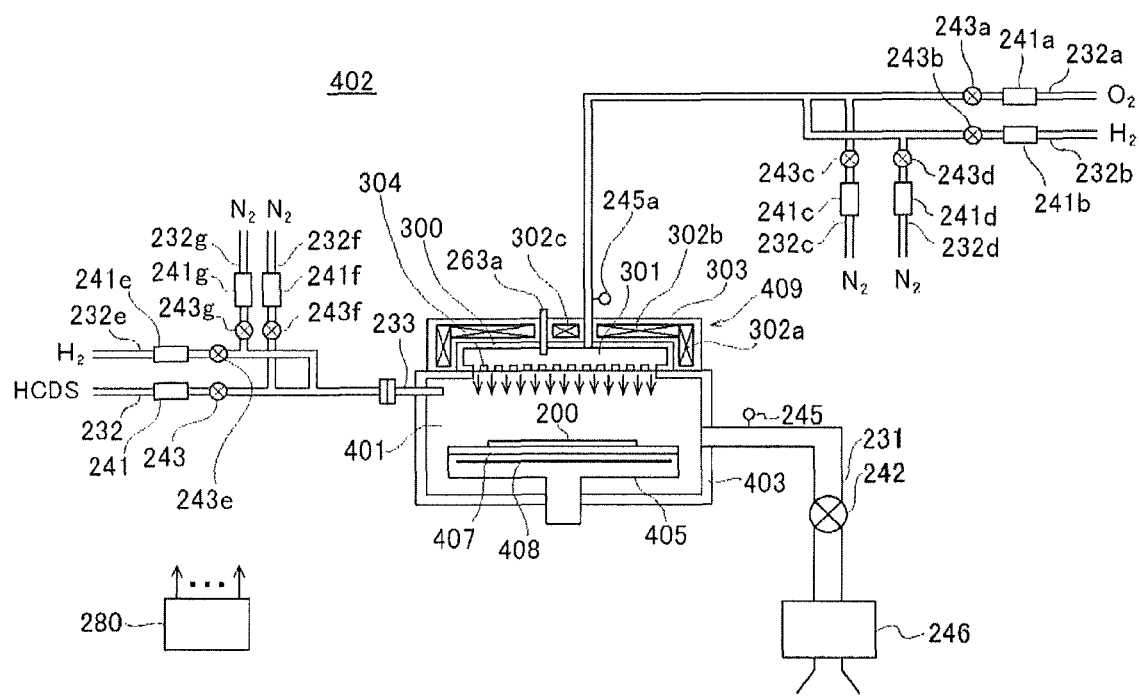
FIG. 8 is a schematic block diagram of the single wafer processing furnace of the substrate processing apparatus according to a modified example of this embodiment, and is a view showing the processing furnace portion in a vertical cross-sectional view.

Further for example, as shown in FIG. 8, the present invention can also be suitably applied to a case that the film formation is performed using the substrate processing apparatus in which the pre-reaction chamber is provided to a shower head, namely, using the substrate processing apparatus in which the shower head portion has a function of the pre-reaction chamber. The processing furnace 402 of this embodiment has the processing vessel 403 forming the processing chamber 401; the shower head 409 that supplies a gas into the processing chamber 401 in a shower state; the supporting table 405 including the susceptor 407 for supporting one wafer 200 in a horizontal posture; and a resistance heating heater 408 as the first heating source provided on the supporting table 405. The shower head 409 has the pre-reaction vessel 300 with the pre-reaction chamber 301 formed inside; second heaters 302a, 302b, 302c provided so as to surround a side face and an upper face of a cylindrical body of the pre-reaction vessel 300; and a heat insulating member 303 provided around the pre-reaction vessel 300 and the second heaters 302a, 302b, 302c. A joint piping part is connected to an inlet of the shower head 409, where the oxygen-containing gas supply pipe 232a and the hydrogen-containing gas supply pipe 232b are joined, and a gas dispersion plate 304 is provided to an outlet so that the gas is supplied into the processing chamber 401 in a shower state. In FIG. 8, substantially the same sings and numerals are assigned to the same element described in FIG. 1 and FIG. 2.

According to a modified example shown in FIG. 7, by using the pre-reaction chamber 301 heated to a high temperature, a generation amount of the reactive species such as atomic oxygen (O) can be increased, and the concentration of the reactive species can be remarkably increased. Therefore, even in a case that the cold wall type chamber is used for heating the wafer by light irradiation, the film quality can be improved by the low temperature treatment, similarly to the high temperature treatment, and the film forming rate can be increased similarly to the high temperature treatment. Further, according to the modified examples shown in FIG. 7 and FIG. 8, the piping part connecting the pre-reaction chamber 301 and the processing chamber 201 (401) is eliminated, so that the pre-reaction chamber 301 and the processing chamber 201 (401) are directly connected. Therefore, deactivation of the reactive species such as atomic oxygen (O), etc., generated in the pre-reaction chamber 301 can be prevented. Further, since the piping part is eliminated, a pressure monitoring in the piping part and a pressure adjustment in the piping part can be eliminated, and a structure of the substrate processing apparatus and a pressure control operation can be simplified.

Further, the present invention is not limited to the above-mentioned each embodiment and modified example, and each embodiment and each element of the modified example may be arbitrarily and suitably combined in a range not departing from the gist of the invention.

Further, the present invention can also be realized by changing the process recipe of the existing substrate processing apparatus. When the process recipe is changed, the process recipe is installed on the existing substrate processing apparatus via a telecommunication line or a non-transitory computer-readable recording medium in which the process recipe is recorded, or the process recipe itself can be changed to the process recipe of the present invention by operating an input/output device of the existing substrate processing apparatus.

EXAMPLES

The $SiO_2$ film was formed based on the first sequence of the above-mentioned embodiment, and the relation between the film thickness of the $SiO_2$ film and the temperature (second temperature) in the pre-reaction chamber was evaluated. The HCDS gas was used as the silicon-containing gas, the $O_2$ gas was used as the oxygen-containing gas, and the $H_2$ gas was used as the hydrogen-containing gas. The temperature in the pre-reaction chamber was set in a range of normal temperature to 750° C. The other film forming condition (processing condition in each step) was set in a range of the processing condition described in the above-mentioned embodiment. The result thereof is shown in FIG. 5.

Figure 5:
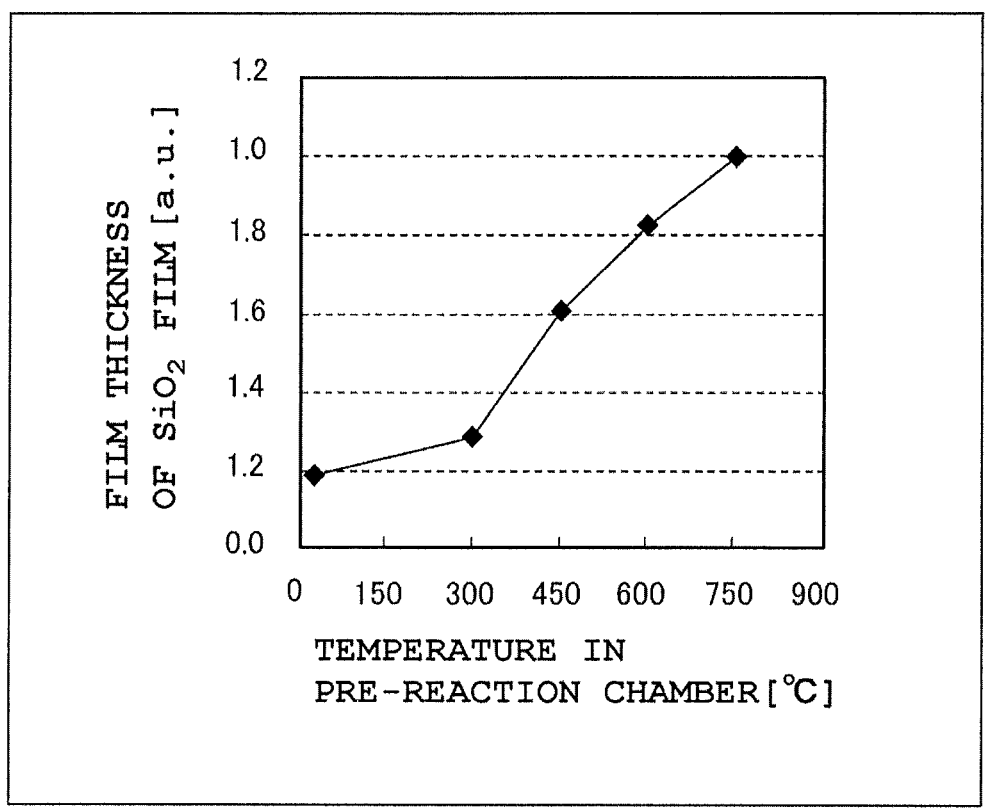
FIG. 5 is a graph chart showing a relation between a film thickness of a SiO2 film and a temperature in a pre-reaction chamber according to an example of the present invention.

FIG. 5 is a graph showing the relation between the film thickness of the $SiO_2$ film and the temperature in the pre-reaction chamber according to this embodiment. In FIG. 5, the temperature (° C.) in the pre-reaction chamber is taken on the horizontal axis, and the film thickness (arbitrary unit (a.u.)) of the $SiO_2$ film is taken on the vertical axis. According to FIG. 5, it is found that the film thickness of the $SiO_2$ film becomes large by increasing the temperature (second temperature) in the pre-reaction chamber. Particularly, it is found that the film forming rate can be greatly improved by setting the temperature (second temperature) in the pre-reaction chamber to 450° C. or more. Namely, it is found that by setting the temperature (second temperature) in the pre-reaction chamber in the range of 450° C. or more, the supply amount of the reactive species to the wafer can be increased, and the film forming rate can be improved in a state that the wafer temperature (first temperature) is maintained in a low temperature (for example, 450° C. or less).

Preferable aspects of the present invention will be supplementarily described hereafter.

(Supplementary Description 1)

According to an aspect of the present invention, there is provided a method of manufacturing a semiconductor device, including:

forming a silicon oxide film having a specific film thickness on a substrate by alternately repeating:

forming a silicon-containing layer on the substrate by supplying a source gas containing silicon, to the substrate housed in a processing chamber and heated to a first temperature; and oxidizing and changing the silicon-containing layer formed on the substrate, to a silicon oxide layer by supplying reactive species containing oxygen to the substrate heated to the first temperature in the processing chamber under a pressure atmosphere of less than atmospheric pressure, the reactive species being generated by causing a reaction between an oxygen-containing gas and a hydrogen-containing gas in a pre-reaction chamber under a pressure atmosphere of less than atmospheric pressure and heated to a second temperature equal to the first temperature or higher than the first temperature.

(Supplementary Description 2)

There is provided the method of the supplementary description 1, wherein the reactive species are the reactive species not containing $H_2O$.

(Supplementary Description 3)

There is provided the method of the supplementary description 1, wherein the reactive species are atomic oxygen.

(Supplementary Description 4)

There is provided the method of the supplementary description 1, wherein the first temperature is set to 100° C. or more and 600° C. or less, and the second temperature is set to 450° C. or more and 1200° C. or less.

(Supplementary Description 5)

There is provided the method of the supplementary description 1, wherein the first temperature is set to 100° C. or more and 450° C. or less, and the second temperature is set to 450° C. or more and 1200° C. or less.

(Supplementary Description 6)

There is provided the method of the supplementary description 1, wherein in changing the silicon-containing layer to the silicon oxide layer, a pressure in the pre-reaction chamber is set to 1 Pa or more and 3999 Pa or less, and a pressure in the processing chamber is set to 1 Pa or more and 1333 Pa or less.

(Supplementary Description 7)

There is provided the method of the supplementary description 1, wherein the pre-reaction chamber is directly connected to the processing chamber.

(Supplementary Description 8)

There is provided the method of the supplementary description 1, wherein the reactive species are supplied to the substrate through a shower head, and the pre-reaction chamber is provided in the shower head.

(Supplementary Description 9)

There is provided the method of the supplementary description 1, wherein in changing the silicon-containing layer to the silicon oxide layer, each gas is supplied into the pre-reaction chamber under a condition that a flow rate of the oxygen-containing gas is larger than a flow rate of the hydrogen-containing gas.

(Supplementary Description 10)

There is provided the method of the supplementary description 1, wherein in changing the silicon-containing layer to the silicon oxide layer, each gas is supplied into the pre-reaction chamber under an oxygen-containing gas rich condition.

(Supplementary Description 11)

There is provided the method of the supplementary description 1, wherein the silicon-containing layer is a silicon layer.

(Supplementary Description 12)

There is provided the method of the supplementary description 1, wherein the silicon-containing layer is formed by deposit of silicon on the substrate.

(Supplementary Description 13)

There is provided the method of the supplementary description 1, wherein the silicon-containing layer is an adsorption layer of the source gas.

(Supplementary Description 14)

There is provided the method of the supplementary description 1, wherein the silicon-containing layer is formed by adsorption of the source gas on the substrate.

(Supplementary Description 15)

There is provided the method of the supplementary description 1, further including modifying the silicon oxide film having the specific film thickness formed on the substrate, by supplying reactive species containing oxygen to the substrate heated to the first temperature or heated to a third temperature higher than the first temperature and lower than the second temperature in the processing chamber under a pressure atmosphere of less than atmospheric pressure, the reactive species being generated by causing a reaction between the oxygen-containing gas and the hydrogen-containing gas in the pre-reaction chamber under a pressure atmosphere of less than atmospheric pressure and heated to the second temperature.

(Supplementary Description 16)

There is provided the method of the supplementary description 1, wherein the oxygen-containing gas is at least one of gases selected from a group consisting of an oxygen gas, an ozone gas, a nitric monoxide gas, and a nitrous oxide gas, and the hydrogen-containing gas is at least one of gases selected from a group consisting of a hydrogen gas, a heavy hydrogen gas, and an ammonia gas.

(Supplementary Description 17)

There is provided the method of the supplementary description 1, wherein the oxygen-containing gas is an oxygen gas, and the hydrogen-containing gas is a hydrogen gas.

(Supplementary Description 18)

According to other aspect of the present invention, there is provided a substrate processing method, including:

forming a silicon oxide film having a specific film thickness on a substrate by alternately repeating:

forming a silicon-containing layer on the substrate by supplying a source gas containing silicon, to the substrate housed in a processing chamber and heated to a first temperature; and oxidizing and changing the silicon-containing layer formed on the substrate, to a silicon oxide layer by supplying reactive species containing oxygen to the substrate heated to the first temperature in the processing chamber under a pressure atmosphere of less than atmospheric pressure, the reactive species being generated by causing a reaction between an oxygen-containing gas and a hydrogen-containing gas in a pre-reaction chamber under a pressure atmosphere of less than atmospheric pressure and heated to a second temperature equal to the first temperature or higher than the first temperature.

(Supplementary Description 19)

According to further other aspect of the present invention, there is provided a substrate processing apparatus, including:

a processing chamber configured to house a substrate and process the substrate;

a first heating source configured to heat the substrate to a first temperature in the processing chamber;

a pre-reaction chamber configured to cause a reaction among a plurality of kinds of gases;

a second heating source configured to heat an inside of the pre-reaction chamber to a second temperature equal to the first temperature or higher than the first temperature;

a source gas supply system configured to supply a source gas containing silicon into the processing chamber;

an oxygen-containing gas supply system configured to supply an oxygen-containing gas into the pre-reaction chamber;

a hydrogen-containing gas supply system configured to supply a hydrogen-containing gas into the pre-reaction chamber;

a pressure adjustment part configured to adjust pressures in the processing chamber and the pre-reaction chamber; and a control part configured to control the first heating source, the second heating source, the source gas supply system, the oxygen-containing gas supply system, the hydrogen-containing gas supply system, and the pressure adjustment part, so that a silicon oxide film having a specific film thickness is formed on the substrate, by alternately repeating a process of forming a silicon-containing layer on the substrate by supplying the source gas to the substrate housed in the processing chamber and heated to the first temperature; and a process of oxidizing and changing the silicon-containing layer formed on the substrate, to an oxide layer by supplying reactive species containing oxygen to the substrate heated to the first temperature in the processing chamber under a pressure atmosphere of less than atmospheric pressure, the reactive species being generated by causing a reaction between the oxygen-containing gas and the hydrogen-containing gas in the pre-reaction chamber under a pressure atmosphere of less than atmospheric pressure and heated to the second temperature.

(Supplementary Description 20)

According to further other aspect of the present invention, there is provided a program for making a computer execute:

a procedure of forming a silicon oxide film having a specific film thickness on a substrate by alternately repeating:

a procedure of forming a silicon-containing layer on the substrate by supplying a source gas containing silicon, to the substrate housed in a processing chamber and heated to a first temperature, in a substrate processing apparatus, and a procedure of oxidizing and changing the silicon-containing layer formed on the substrate, to a silicon oxide layer by supplying reactive species containing oxygen to the substrate heated to the first temperature in the processing chamber under a pressure atmosphere of less than atmospheric pressure, the reactive species being generated by causing a reaction between an oxygen-containing gas and a hydrogen-containing gas in a pre-reaction chamber under a pressure atmosphere of less than atmospheric pressure and heated to a second temperature equal to the first temperature or higher than the first temperature.

(Supplementary Description 21)

According to further other aspect of the present invention, there is provided a computer readable recording medium, recording a program for making a computer execute:

a procedure of forming a silicon oxide film having a specific film thickness on a substrate by alternately repeating:

a procedure of forming a silicon-containing layer on the substrate by supplying a source gas containing silicon, to the substrate housed in a processing chamber and heated to a first temperature, in a substrate processing apparatus, and a procedure of oxidizing and changing the silicon-containing layer formed on the substrate, to a silicon oxide layer by supplying reactive species containing oxygen to the substrate heated to the first temperature in the processing chamber under a pressure atmosphere of less than atmospheric pressure, the reactive species being generated by causing a reaction between an oxygen-containing gas and a hydrogen-containing gas in a pre-reaction chamber under a pressure atmosphere of less than atmospheric pressure and heated to a second temperature equal to the first temperature or higher than the first temperature.

DESCRIPTION OF SIGNS AND NUMERALS

200 Wafer
201 Processing chamber
202 Processing furnace
203 Process tube
207 First heater
231 Exhaust pipe
232 Source gas supply pipe
232a Oxygen-containing gas supply pipe
232b Hydrogen-containing gas supply pipe
232h Reaction gas supply pipe
244 APC valve
245 Pressure sensor
245a Pressure sensor
245b Pressure sensor
246 Vacuum pump
263 Temperature sensor
263a Temperature sensor
280 Controller
300 Pre-reaction vessel
301 Pre-reaction chamber
302 Second heater

The invention claimed is:

1. A method of manufacturing a semiconductor device, comprising:
    forming a silicon oxide film having a specific film thickness on a substrate by repeating the following steps multiple times in the following order:
        forming a silicon-containing layer on the substrate by supplying a source gas containing silicon to the substrate housed in a processing chamber and heated to a first temperature;
        discharging the source gas remaining in the processing chamber from the processing chamber;
        oxidizing and changing the silicon-containing layer formed on the substrate to a silicon oxide layer by supplying reactive species containing oxygen to the substrate heated to the first temperature in the processing chamber under a pressure atmosphere of less than atmospheric pressure, the reactive species being generated in a pre-reaction chamber under a pressure atmosphere of less than atmospheric pressure and a second temperature equal to or higher than the first temperature by causing a reaction between an oxygen-containing gas and a hydrogen-containing gas in a non-plasma atmosphere; and
        discharging the reactive species, the oxygen-containing gas, and the hydrogen-containing gas remaining in the processing chamber from the processing chamber.

2. The method of claim 1, wherein the reactive species are the reactive species not containing $H_2O$.

3. The method of claim 1, wherein the reactive species are atomic oxygen.

4. The method of claim 1, wherein the first temperature is set to 100° C. or more and 600° C. or less, and the second temperature is set to 450° C. or more and 1200° C. or less.

5. The method of claim 1, wherein the first temperature is set to 100° C. or more and 450° C. or less, and the second temperature is set to 450° C. or more and 1200° C. or less.

6. The method of claim 1, wherein in changing the silicon-containing layer to the silicon oxide layer, a pressure in the pre-reaction chamber is set to 1 Pa or more and 3999 Pa or less, and a pressure in the processing chamber is set to 1 Pa or more and 1333 Pa or less.

7. The method of claim 1, wherein the pre-reaction chamber is directly connected to the processing chamber.

8. The method of claim 1, wherein the reactive species are supplied to the substrate through a shower head, and the pre-reaction chamber is provided in the shower head.

9. The method according to claim 1, wherein in changing the silicon-containing layer to the silicon oxide layer, each gas is supplied into the pre-reaction chamber under a condition that a flow rate of the oxygen-containing gas is larger than a flow rate of the hydrogen-containing gas.

10. The method according to claim 1, wherein in changing the silicon-containing layer to the silicon oxide layer, each gas is supplied into the pre-reaction chamber under an oxygen-containing gas rich condition.

11. The method according to claim 1, further comprising:
    modifying the silicon oxide film having the specific film thickness formed on the substrate by supplying reactive species containing oxygen to the substrate heated to the first temperature or heated to a third temperature higher than the first temperature and lower than the second temperature in the processing chamber under a pressure atmosphere of less than atmospheric pressure, the reactive species being generated by causing a reaction between the oxygen-containing gas and the hydrogen-containing gas in a non-plasma atmosphere in the pre-reaction chamber, under a pressure atmosphere of less than atmospheric pressure and heated to the second temperature.

12. The method according to claim 1, wherein the silicon-containing layer is a silicon layer having a thickness of less than one atomic layer to several atomic layers.

13. A substrate processing apparatus, comprising:
   a processing chamber configured to house a substrate and process the substrate;
   a first heating source configured to heat the substrate to a first temperature in the processing chamber;
   a pre-reaction chamber configured to cause a reaction among a plurality of kinds of gases;
   a second heating source configured to heat an inside of the pre-reaction chamber to a second temperature equal to the first temperature or higher than the first temperature;
   a source gas supply system configured to supply a source gas containing silicon into the processing chamber;
   an oxygen-containing gas supply system configured to supply an oxygen-containing gas into the pre-reaction chamber;
   a hydrogen-containing gas supply system configured to supply a hydrogen-containing gas into the pre-reaction chamber;
   a pressure adjustment part configured to adjust pressures in the processing chamber and the pre-reaction chamber; and
   a control part configured to control the first heating source, the second heating source, the source gas supply system, the oxygen-containing gas supply system, the hydrogen-containing gas supply system, and the pressure adjustment part, so that a silicon oxide film having a specific film thickness is formed on the substrate, by repeating multiple times in the following order:
      a process of forming a silicon-containing layer on the substrate by supplying the source gas to the substrate housed in the processing chamber and heated to the first temperature;
      a process of discharging the source gas remaining in the processing chamber from the processing chamber;
      a process of oxidizing and changing the silicon-containing layer formed on the substrate to an oxide layer by supplying reactive species containing oxygen to the substrate heated to the first temperature in the processing chamber under a pressure atmosphere of less than atmospheric pressure, the reactive species being generated in a pre-reaction chamber under a pressure atmosphere of less than atmospheric pressure and a second temperature equal to or higher than the first temperature by causing a reaction between an oxygen-containing gas and a hydrogen-containing gas in a non-plasma atmosphere; and
      a process of discharging the reactive species, the oxygen-containing gas, and the hydrogen-containing gas remaining in the processing chamber from the processing chamber.

14. A non-transitory computer readable recording medium having a program for making a computer execute:
   a procedure of forming a silicon oxide film having a specific film thickness on a substrate by repeating multiple times in the following order:
      a procedure of forming a silicon-containing layer on the substrate by supplying a source gas containing silicon to the substrate housed in a processing chamber and heated to a first temperature, in a substrate processing apparatus,
      a procedure of discharging the source gas remaining in the processing chamber from the processing chamber;
      a procedure of oxidizing and changing the silicon-containing layer formed on the substrate to a silicon oxide layer by supplying reactive species containing oxygen to the substrate heated to the first temperature in the processing chamber under a pressure atmosphere of less than atmospheric pressure, the reactive species being generated in a pre-reaction chamber under a pressure atmosphere of less than atmospheric pressure and a second temperature equal to or higher than the first temperature by causing a reaction between an oxygen-containing gas and a hydrogen-containing gas in a non-plasma atmosphere; and
      a procedure of discharging the reactive species, the oxygen-containing gas, and the hydrogen-containing gas remaining in the processing chamber from the processing chamber.

* * * * *